(12) United States Patent
Park

(10) Patent No.: US 8,785,952 B2
(45) Date of Patent: Jul. 22, 2014

(54) LIGHT EMITTING DEVICE AND LIGHT EMITTING DEVICE PACKAGE INCLUDING THE SAME

(75) Inventor: Dongwook Park, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 53 days.

(21) Appl. No.: 13/366,991

(22) Filed: Feb. 6, 2012

(65) Prior Publication Data

US 2012/0132946 A1    May 31, 2012

(30) Foreign Application Priority Data

Oct. 10, 2011  (KR) .................. 10-2011-0102986
Oct. 12, 2011  (KR) .................. 10-2011-0104233

(51) Int. Cl.
  *H01L 33/60*  (2010.01)

(52) U.S. Cl.
  USPC ............. 257/98; 257/91; 257/95; 257/89; 257/88; 257/79; 257/E33.067; 257/E33.074; 257/E33.002; 257/E33.035; 257/E21.529; 345/8; 438/22; 438/26; 438/27; 438/40; 313/502; 313/506

(58) Field of Classification Search
  USPC .............. 257/98, 89, E27.121, E33.012, 257/E33.068, E33.025, 76, 99, 77, 43, 40, 257/88, 79, 91
  See application file for complete search history.

(56) References Cited

U.S. PATENT DOCUMENTS

| 2006/0169994 | A1 | 8/2006 | Tu et al. ..................... 257/89 |
| 2011/0180831 | A1 | 7/2011 | Song ........................... 257/98 |
| 2011/0233588 | A1* | 9/2011 | Deguchi et al. ............. 257/98 |

FOREIGN PATENT DOCUMENTS

EP    1 256 987 A2    11/2002

OTHER PUBLICATIONS

European Search Report dated Jan. 14, 2013 issued in Application No. 12 15 5005.

* cited by examiner

*Primary Examiner* — Jerome Jackson, Jr.
*Assistant Examiner* — Bo Fan
(74) *Attorney, Agent, or Firm* — KED & Associates LLP

(57) ABSTRACT

A light emitting device is disclosed. The light emitting device includes a first electrode and a second electrode, which have different areas, thereby achieving enhanced bonding reliability.

4 Claims, 26 Drawing Sheets

LIGHT EMITTING DEVICE AND LIGHT EMITTING DEVICE PACKAGE INCLUDING THE SAME

CROSS-REFERENCE TO RELATED APPLICATION

This application claims the priority benefit of Korean Patent Application No. 10-2011-0102986, filed on, Oct. 10, 2011 and Application No. 10-2011-0104233, filed on, Oct. 12, 2011 in the Korean Intellectual Property Office, the disclosure of which is incorporated herein by reference.

BACKGROUND

1. Field

Embodiments relate to a light emitting device, which is of a flip chip type with enhanced light emission efficiency and exhibits stability and reliability upon bonding to a light emitting device package.

2. Description of the Related Art

Light Emitting Diodes (LEDs) are a representative example of light emitting devices, which convert electric signals into infrared light or visible light using characteristics of compound semiconductors. Such LEDs are being utilized in home appliances, remote controllers, electronic bulletin boards, displays and various other automated machines. The application range of LEDs is gradually increasing.

Generally, miniature LEDs are fabricated into surface mount devices so as to be directly mounted on a Printed Circuit Board (PCB) and hence, an LED lamp, which serves as a display device, is being developed into a surface mount device. The surface mount device can substitute for a conventional simple lamp and is used in a variety of color on-and-off displays and letter/image displays.

The increased application range of LEDs causes a demand for higher brightness of household lights as well as emergency lights and therefore, it is important to enhance brightness of LEDs.

SUMMARY

Embodiments provide a light emitting device, which is of a flip chip type with enhanced light emission efficiency and exhibits stability and reliability upon bonding to a light emitting device package.

In one embodiment, a light emitting device includes a support member, a light emitting structure including a first semiconductor layer disposed on the support member, a second semiconductor layer and an active layer between the first semiconductor layer and the second semiconductor layer, a first electrode disposed on the first semiconductor layer in a first region, through which the first semiconductor layer is exposed, a second electrode disposed on the second semiconductor layer, and an insulating layer disposed at least between the first electrode and the light emitting structure, wherein the first semiconductor layer and the second semiconductor layer are different conductive semiconductor layers, the active layer includes at least one pair of a well layer and a barrier layer, and the well layer has a smaller band gap than the barrier layer, and wherein an area of an upper surface of the first electrode is in a range of 40% to 90% an area of the second semiconductor layer.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
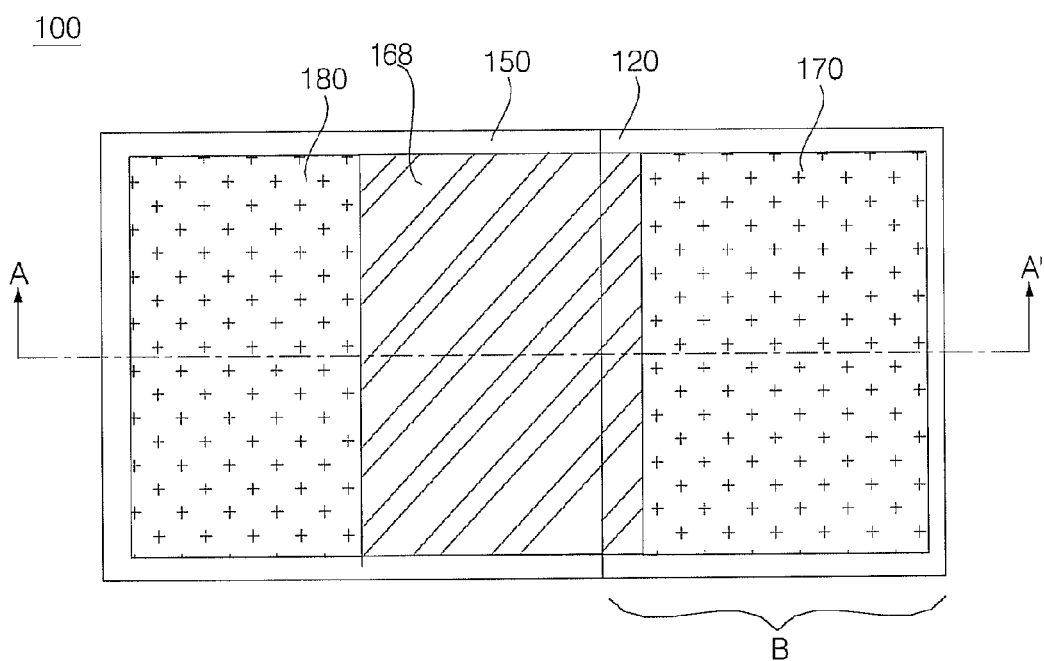
FIG. 1 is a plan view showing a light emitting device in accordance with an embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
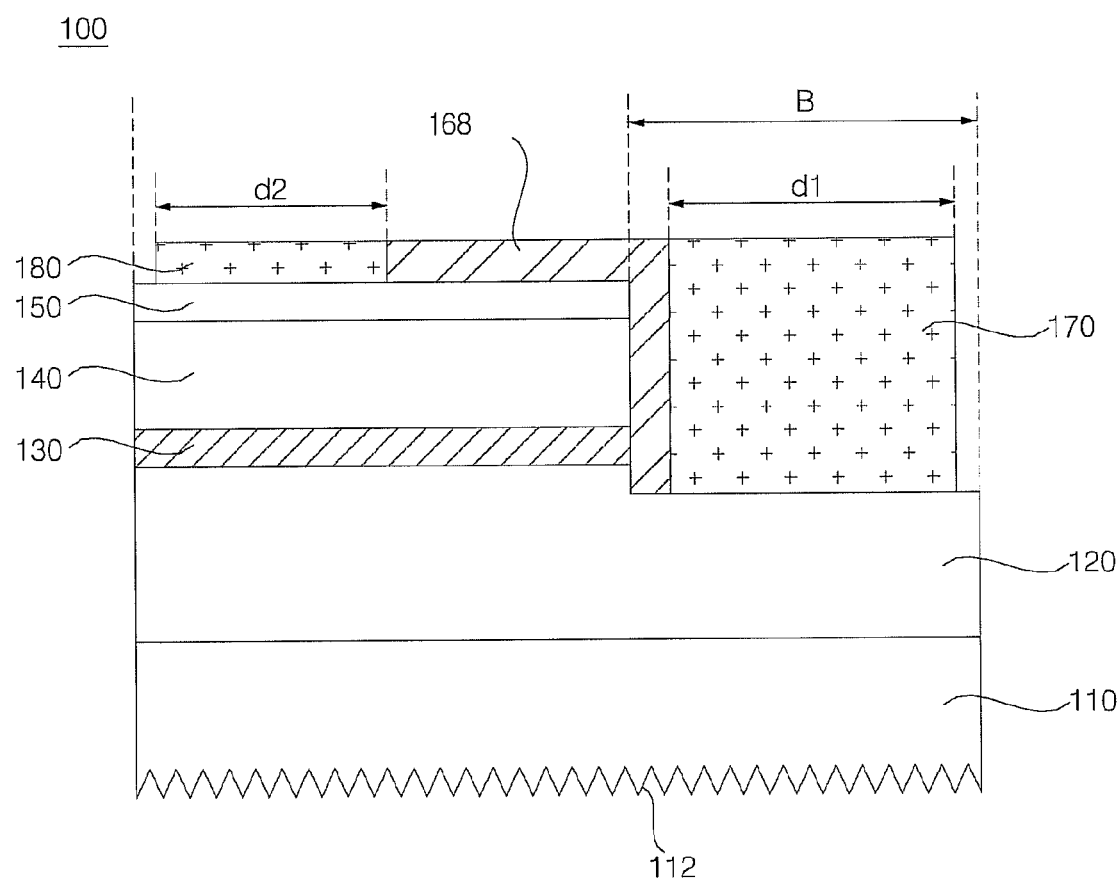
FIG. 2 is a sectional view taken along the line A-A' of the light emitting device shown in FIG. 1.

FIG. 1 is a plan view showing a light emitting device in accordance with an embodiment, and FIG. 2 is a sectional view taken along the line A-A' of the light emitting device shown in FIG. 1.

Referring to FIGS. 1 and 2, the light emitting device 100 may include a support member 110 and a light emitting structure disposed on the support member 110. The light emitting structure may include a first semiconductor layer 120, a second semiconductor layer 140 and an active layer 130 interposed between the first semiconductor layer 120 and the second semiconductor layer 140.

The support member 110 may be formed of a light transmittable material including, for example, any one of sapphire ($Al_2O_3$), GaN, ZnO and AlO, although the disclosure is not limited thereto. Alternatively, a SiC support member, which has a greater thermal conductivity than the sapphire ($Al_2O_3$) support member, may be used. It is noted that the support member 110 may have an index of refraction less than that of the first semiconductor layer 120, for the sake of light extraction efficiency.

To further enhance light extraction efficiency, an uneven surface pattern 112 may be formed at a lower surface of the support member 110.

The uneven surface pattern 112 may be formed at one surface of the support member 110 opposite to the other surface where the light emitting structure is formed. The uneven surface pattern 112 may be formed by etching, more particularly, dry etching or wet etching, although the disclosure is not limited thereto. Such an uneven surface structure serves to prevent total reflection of light to be emitted, which may enhance light extraction efficiency.

A buffer layer (not shown) may be disposed on the support member 110, so as to relieve lattice mismatch between the support member 110 and the first semiconductor layer 120 and to enable easy growth of the first semiconductor layer 120. The buffer layer (not shown) may be grown under a low temperature atmosphere and may be formed of a material capable of relieving a difference in a lattice constant between the first semiconductor layer 120 and the support member 110. For example, the buffer layer (not shown) may be formed of any one material selected from among GaN, InN, AlN, AlInN, InGaN, AlGaN and InAlGaN, although the disclosure is not limited thereto.

The light emitting structure, which includes the first semiconductor layer 120, the active layer 130 and the second semiconductor layer 140, may be formed on the buffer layer (not shown).

The first semiconductor layer 120 may be disposed on the buffer layer (not shown). The first semiconductor layer 120 may be an n-type semiconductor layer and may provide the active layer 130 with electrons. In one example, the first semiconductor layer 120 may be formed of a semiconductor material having a composition of $In_xAl_yGa_{1-x-y}N$ ($0 \leq x \leq 1$, $0 \leq y \leq 1$, $0 \leq x+y \leq 1$). For example, the first semiconductor layer 120 may be formed of a material selected from among GaN, AlN, AlGaN, InGaN, InN, InAlGaN, AlInN and the like. Additionally, the first semiconductor layer 120 may be doped with an n-type dopant, such as Si, Ge, Sn and the like.

An undoped semiconductor layer (not shown) may be further provided beneath the first semiconductor layer 120, although the disclosure is not limited thereto. The undoped semiconductor layer (not shown) serves to enhance crystallization of the first semiconductor layer 120. The undoped semiconductor layer may be identical to the first semiconductor layer 120, except that it is not doped with an n-type dopant and has lower electric conductivity than the first semiconductor layer 120.

The active layer 130 may be formed on the first semiconductor layer 120. The active layer 130 may be formed of a group III-V compound semiconductor material to have a single or multiple quantum well structure, a quantum wire structure, a quantum dot structure or the like.

In the case in which the active layer 130 has a quantum well structure, for example, the active layer 130 may have a single or multiple quantum well structure including a well layer having a composition of $In_xAl_yGa_{1-x-y}N$ ($0 \leq x \leq 1$, $0 \leq y \leq 1$, $0 \leq x+y \leq 1$) and a barrier layer having a composition of $In_aAl$-

$_bGa_{1-a-b}N$ ($0 \leq a \leq 1$, $0 \leq b \leq 1$, $0 \leq a+b \leq 1$). The well layer may be formed of a material having a smaller band gap than the barrier layer.

A conductive clad layer (not shown) may be formed above and/or below the active layer 130. The conductive clad layer (not shown) may be formed of an AlGaN-based semiconductor and may have a greater band gap than the active layer 130.

The second semiconductor layer 140 may be a p-type semiconductor layer and may provide the active layer 130 with holes. In one example, the second semiconductor layer 140 may be formed of a semiconductor material having a composition of $In_xAl_yGa_{1-x-y}N$ ($0 \leq x \leq 1$, $0 \leq y \leq 1$, $0 \leq x+y \leq 1$). For example, the second semiconductor layer 140 may be formed of a material selected from among GaN, AlN, AlGaN, InGaN, InN, InAlGaN, AlInN and the like. Additionally, the second semiconductor layer 140 may be doped with a p-type dopant, such as Mg, Zn, Ca, Sr, Ba and the like.

An intermediate layer (not shown) may be formed between the active layer 130 and the second semiconductor layer 140. The intermediate layer may be an electron blocking layer, which prevents electrons, injected from the first semiconductor layer 120 into the active layer 130, from moving to the second semiconductor layer 140, rather than being recombined in the active layer 130, when high current is applied. The intermediate layer may have a greater band gap than the active layer 130, which may prevent electrons, injected from the first semiconductor layer 120, from being injected into the second semiconductor layer 140, rather than being recombined in the active layer 130. Accordingly, the intermediate layer may enhance electron-hole recombination possibility in the active layer 130 and may prevent current leakage.

The above described intermediate layer may have a greater band gap than the barrier layer included in the active layer 130 and may be a semiconductor layer containing Al, such as p-type AlGaN, although the disclosure is not limited thereto.

The first semiconductor layer 120, the active layer 130 and the second semiconductor layer 140 as described above, for example, may be formed using Metal Organic Chemical Vapor Deposition (MOCVD), Chemical Vapor Deposition (CVD), Plasma Enhanced Chemical Vapor Deposition (PECVD), Molecular Beam Epitaxy (MBE), Hydride Vapor Phase Epitaxy (HVPE), sputtering and the like, although the disclosure is not limited thereto.

The conductive dopant contained in first semiconductor layer 120 and the second semiconductor layer 140 may have an even or uneven doping density. In other words, the plurality of semiconductor layers may be formed within a wide doping density range, although the disclosure is not limited thereto.

Alternatively, the first semiconductor layer 120 may be a p-type semiconductor layer, the second semiconductor layer 140 may be an n-type semiconductor layer, and a third semiconductor layer (not shown), which includes an n-type or p-type semiconductor layer, may be formed on the second semiconductor layer 140. Accordingly, the light emitting device 100 may have at least one among np, pn, npn and pnp junction structures.

A light transmittable electrode layer 150 may be disposed on the second semiconductor layer 140. In this case, a second electrode 180 may be connected to the second semiconductor layer 140 or may be connected to the light transmittable electrode layer 150, although the disclosure is not limited thereto.

The light transmittable electrode layer 150 may be formed of at least one selected from among ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, Ni/$IrO_x$/Au and Ni/$IrO_x$/Au/ITO. The light transmittable electrode layer 150 may be formed over the entire outer surface of the second semiconductor layer 140, so as to prevent current crowding.

The light emitting device 100 may include a first region B, which exposes a part of an upper surface of the first semiconductor layer 120 to the outside. The light emitting device 100 may include a first electrode 170, which is disposed on the first semiconductor layer 120 in the first region B, and a second electrode 180 which is disposed on the second semiconductor layer 140. An insulating layer 168 may be disposed at least between the light emitting structure and the first electrode 170. The first electrode 170 may be disposed on the exposed part of the upper surface of the first semiconductor layer 120 in the first region B. More particularly, at least a part of the second semiconductor layer 140 and a part of the active layer 130 are removed to expose the first semiconductor layer 120 in the first region B, and the first electrode 170 is disposed on the first semiconductor layer 120 in the first region B.

The first electrode 170 may be spaced apart from a lateral surface of the second semiconductor layer 140 and a lateral surface of the active layer 130 by a first distance. Additionally, upper and lower surfaces of the first electrode 170 may have different areas.

When viewed from the top, an area of an upper surface of the first electrode 170 may be in a range of 40% to 99% an area of the second semiconductor layer 140. Here, the area is measured on the basis of the surface when the light emitting device 100 is viewed from the top. This will be equally applied in the following description. If the area of the first electrode 170 is 40% or less the area of the second semiconductor layer 140, bonding the light emitting device 100 in a flip chip manner to a light emitting device package may require bumps because of a small electrode area and also, may provide insufficient fixing force, which may result in deterioration in the reliability and stability of the light emitting device package upon bonding. If the area of the first electrode 170 is 99% or more the area of the second semiconductor layer 140, placing the first electrode 170 may require removal of a great amount of the second semiconductor layer 140 and the active layer 130 of the light emitting device 100, which may result in deterioration in light emission efficiency. Accordingly, by forming the first electrode 170 as described above, both appropriate light emission efficiency and flip chip bonding stability may be accomplished.

The first and second electrodes 170 and 180 may contain a conductive material, for example, a metal selected from among In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or may contain alloys thereof and may be formed in a single layer or in multiple layers, although the disclosure is not limited thereto.

The first, distance may have a value suitable to prevent short circuit and to ensure insertion of the insulating layer, although the disclosure is not limited thereto.

An area of the first region B may be in a range of 41% to 100% the area of the second semiconductor layer 140. In other words, when viewed from the top, the area of the first region B may be greater than the area of the first electrode 170, in order to allow the first electrode 170 to be disposed in the first region B, although the disclosure is not limited thereto.

With regard to the second electrode 180, if an area of the second electrode 180 is excessively greater than an area of the second semiconductor layer 140, light extraction efficiency of the light emitting device 100 may be deteriorated. On the other hand, if the area of the second electrode 180 is excessively less than the area of the second semiconductor layer 140, the light emitting device 100 problematically exhibits poor reliability with respect to flip chip bonding to a light emitting device package. Accordingly, the area of the second electrode 180 may be in a range of 40% to 99% the area of the second semiconductor layer 140, although the disclosure is not limited thereto.

The first electrode 170 or the second electrode 180 may have a tetragonal shape, a polygonal shape or a circular shape when viewed from the top, although the disclosure is not limited thereto.

In this case, the first region B may have a tetragonal shape, a polygonal shape or a circular shape when viewed from the top, although the disclosure is not limited thereto.

Although it is desirable that the first region B and the first electrode 170 have the same shape when viewed from the top, the first region B and the first electrode 170 may have different shapes.

Upper surfaces of the first electrode 170 and the second electrode 180 may be disposed on the same line. This configuration does not need bumps when the light emitting device 100 is flip chip bonded to a light emitting device package and therefore, results in saving of bump costs. Further, arranging the electrodes at the same height may enhance bonding reliability.

The insulating layer 168 may be disposed at least between the light emitting structure and the first electrode 170. The insulating layer 168 may be formed at least between the first electrode 170 and the lateral surfaces of the second semiconductor layer 140 and the active layer 130. This serves to prevent short circuit of the first electrode 170 and the second semiconductor layer 140. The insulating layer 168 may contain a non-conductive organic material or inorganic material. In one example, the insulating layer 168 may be formed of urethane, polyester or acryl and may be formed in a single layer or in multiple layers, although the disclosure is not limited thereto.

To further prevent short circuit, the insulating layer 168 may be formed from between the first electrode 170 and the lateral surfaces of the second semiconductor layer 140 and the active layer 130 until it reaches the same line as the upper surfaces of the first electrode 170 and the second electrode 180.

Through provision of the insulating layer 168, the light emitting device 100 is free from short circuit and may achieve enhanced reliability upon flip chip bonding. Specifically, in some embodiments, it may be possible to omit bumps which have been used to adjust a difference in the height of the electrodes when a conventional light emitting device is flip chip bonded, which may enhance bonding convenience and reduce bonding time.

Figure 3:
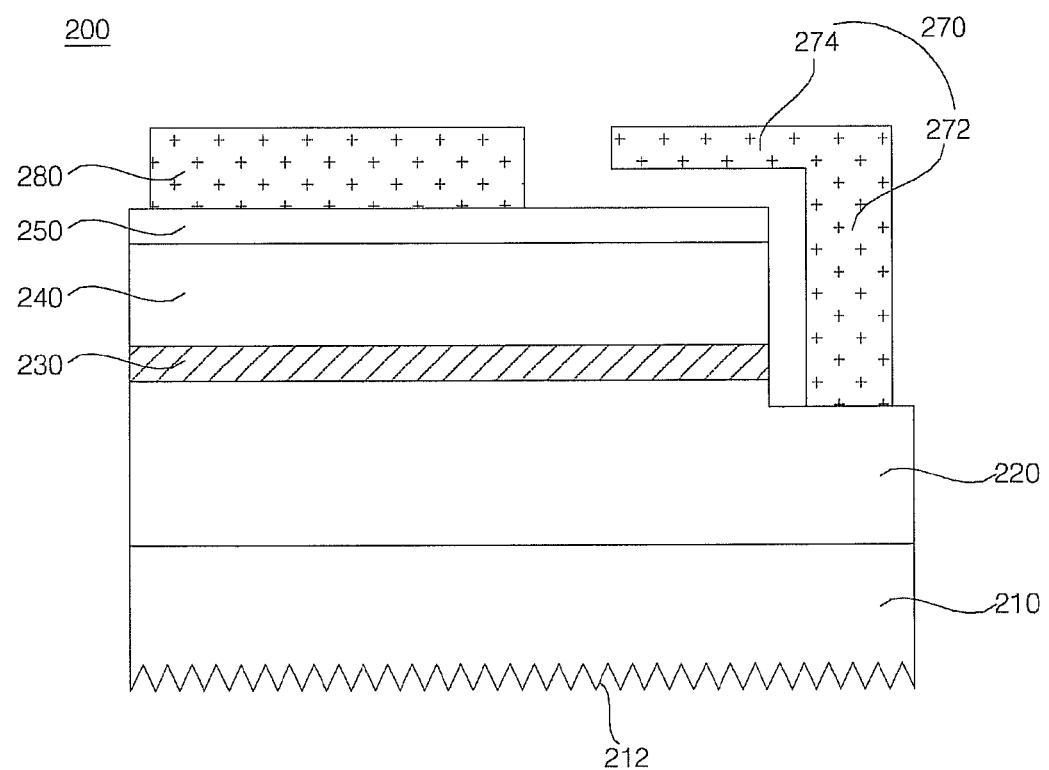
FIG. 3 is a sectional view showing a light emitting device in accordance with another embodiment.

FIG. 3 is a sectional view showing a light emitting device in accordance with another embodiment.

Referring to FIG. 3, the light emitting device 200 in accordance with the embodiment may include a support member 210 and a light emitting structure disposed on the support member 210. The light emitting structure may include a first semiconductor layer 220, a second semiconductor layer 240 and an active layer 230 between the first semiconductor layer 220 and the second semiconductor layer 240. A description of the same constituent elements as those described with reference to FIGS. 1 and 2 will be omitted hereinafter.

A light transmittable electrode layer 250 may be disposed on the second semiconductor layer 240. In this case, a second electrode 280 may be connected to the second semiconductor layer 240 or may be connected to the light transmittable electrode layer 250, although the disclosure is not limited thereto.

The light emitting device 200 may include a first region B, which exposes a part of an upper surface of the first semiconductor layer 220 to the outside. The light emitting device 200 may include a first electrode 270, which is disposed on the first semiconductor layer 220 in the first region B, and a second electrode 280 which is disposed on the second semiconductor layer 140.

The first electrode 270 may be spaced apart from a lateral surface of the second semiconductor layer 240 and a lateral surface of the active layer 230 by a first distance.

The first electrode 270 may include a lower electrode 272 connected to the first semiconductor layer 220 and an upper electrode 274 connected to one end of the lower electrode 272, the upper electrode 274 being configured to constitute an upper surface of the first electrode 270.

The lower electrode 272 may extend at least up to a height of the second semiconductor layer 240. Also, the lower electrode 272 may be formed of the same material as that of the above described second electrode 280.

The upper electrode 274 may be connected to one end of the lower electrode 272 so as to protrude inward of the light emitting structure. A partial region of the upper electrode 274 may vertically overlap with the second semiconductor layer 240 and the upper electrode 274 may be spaced apart from an upper surface of the second semiconductor layer 240. Thus, the first electrode 270 may have "L"-shaped cross section. That is, an upper surface of the upper electrode 274 may be a surface to be bonded to a light emitting device package, and the lower electrode 272 may serve to connect the first semiconductor layer 220 and the upper electrode 274 to each other.

If an area of the lower electrode 272 is less than an area of the upper electrode 274 by 10%, supply of electricity to the first semiconductor layer 220 may be problematic. If the area of the lower electrode 272 is greater than the area of the upper electrode 274 by 50%, the light emission efficiency of the light emitting device 200 may be deteriorated because it is necessary to etch the first region B based on the area of the lower electrode 272. Therefore, the area of the lower electrode 272 viewed from the top may be in a range of 10% to 50% the area of the upper electrode 274.

Here, the area of an upper surface of the first electrode 270 viewed from the top means the area of the upper electrode 274 viewed from the top. The area of the upper surface of the first electrode 270 viewed from the top may be in a range of 40% to 99% the area of the second semiconductor layer 240.

As such, when the area of the lower electrode 272 is less than the area of the upper electrode 274 and the upper electrode 274 has a sufficient area, removal regions of the second semiconductor layer 240 and the active layer 230 of the light emitting device 200 are reduced, which may minimize deterioration in light emission efficiency and provide stability upon flip chip bonding.

Figure 4:
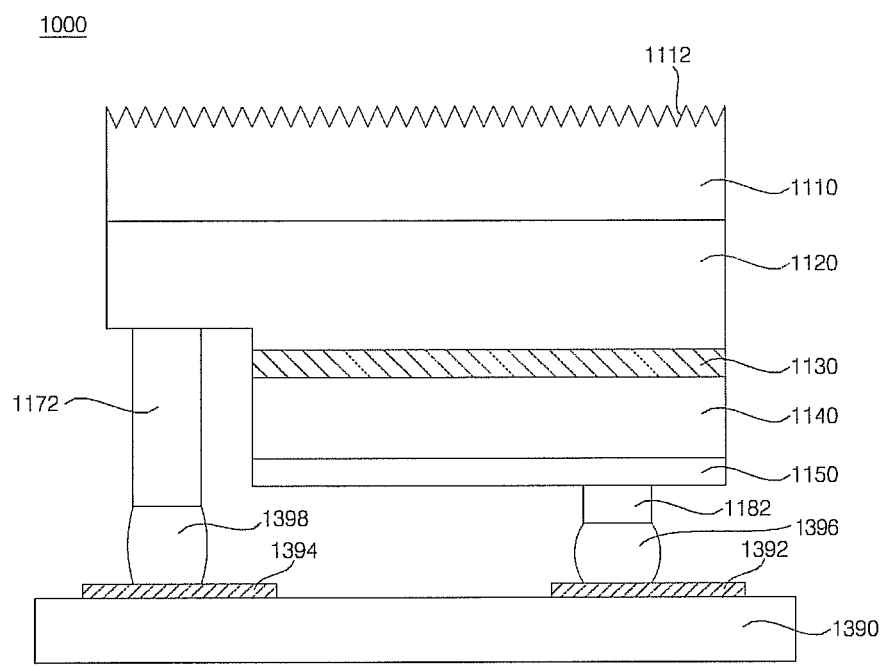
FIG. 4 is a sectional view showing a configuration in which a conventional light emitting device is flip chip bonded to a package substrate.
Figure 5:
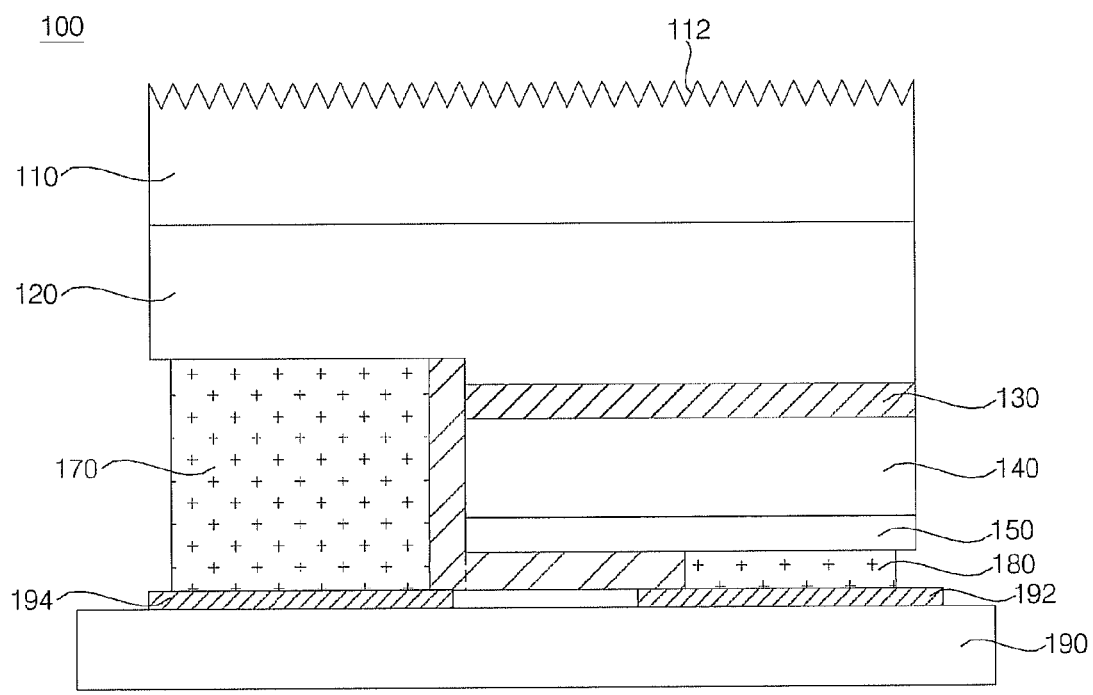
FIG. 5 is a sectional view showing a configuration in which the light emitting device in accordance with the embodiment is flip chip bonded to a package substrate.

FIG. 4 is a sectional view showing a configuration in which a conventional light emitting device is flip chip bonded to a package substrate, and FIG. 5 is a sectional view showing a configuration in which the light emitting device in accordance with the embodiment is flip chip bonded to a package substrate.

Referring to FIG. 4, a conventional light emitting device 1000 is illustrated as being flip chip bonded onto a package substrate 1390. Conductor patterns 1392 and 1394 are formed on the package substrate 1390. The conductor patterns 1392 and 1394 are electrically connected respectively to a second electrode pad 1182 and a first electrode pad 1172 of the flip chip type light emitting device 1000 via solders 1396 and 1398.

The conventional light emitting device 1000 needs bumps due to a height difference between the second electrode pad 1182 and the first electrode pad 1172 when bonded to the package substrate 1390, which may increase bonding costs and deteriorate stability upon bonding.

Referring to FIG. 5, the light emitting device 100 is illustrated as being flip chip bonded onto a package substrate 190. Conductor patterns 192 and 194 are formed on the package substrate 190. The conductor patterns 192 and 194 are electrically connected respectively in a flip chip manner to the second electrode 180 and the first electrode 170.

Through use of the wide area electrodes as described above, bonding stability may be enhanced and a vertical height of the electrode may be easily increased, which advantageously eliminates a need for separate bumps.

In the case of the flip chip type light emitting device, radiation is the most important problem as the brightness of the light emitting device increases. Thus, the wide area electrode, which exhibits effective radiation, may be suitable for a high brightness light emitting device.

Figure 6:
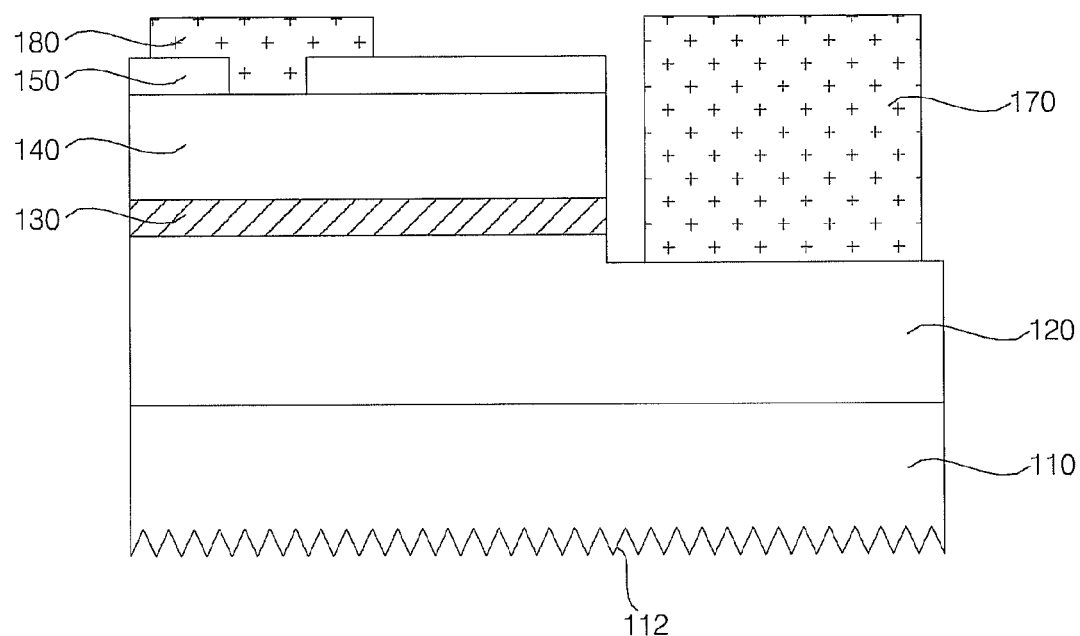
FIG. 6 is a sectional view showing a light emitting device in accordance with an alternative embodiment.

FIG. 6 is a sectional view showing a light emitting device in accordance with an alternative embodiment.

Referring to FIG. 6, as compared to the light emitting device of FIG. 2, the light emitting device 100 in accordance with the alternative embodiment has differences in that the insulating layer 168 is not provided and that the second electrode 180 penetrates the light transmittable electrode layer 150 so as to be connected to the second semiconductor layer 140. An empty space between the first electrode 170 and the light emitting structure may prevent short circuit of the light emitting device 100.

The second electrode 180 may be electrically connected to the second semiconductor layer 140. For example, as illustrated in FIG. 6, the second electrode 180 may penetrate the light transmittable electrode layer 150 so as to be connected to the second semiconductor layer 140 and may be disposed on the light transmittable electrode layer 150, although the disclosure is not limited thereto.

Figure 7:
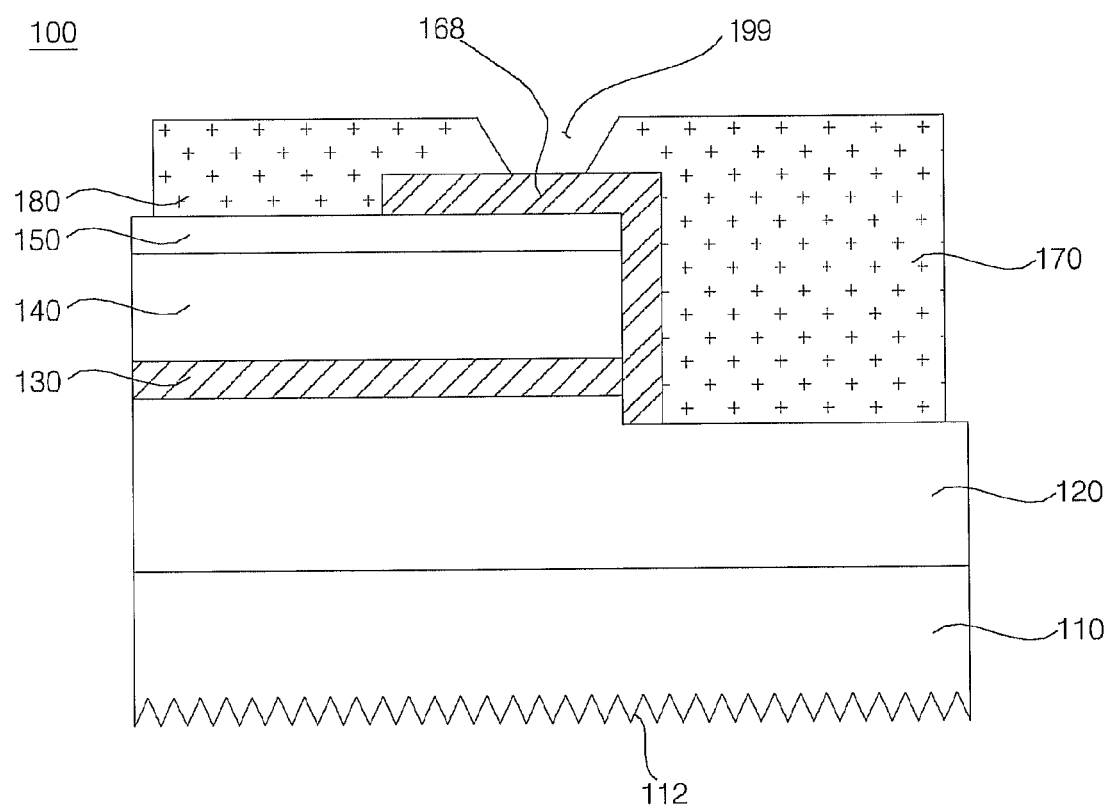
FIG. 7 is a sectional view showing a light emitting device in accordance with an alternative embodiment.

FIG. 7 is a sectional view showing a light emitting device in accordance with an alternative embodiment.

Referring to FIG. 7, as compared to the light emitting device of FIG. 2, the light emitting device 100 in accordance with the alternative embodiment has differences in the shape and height of the first electrode 170 and the second electrode 180.

The upper surfaces of the first electrode 170 and the second electrode 180 may be disposed higher than the upper surface of the insulating layer 168 such that a spacer 199 is provided on the insulating layer 168.

The first electrode 170 and the second electrode 180 may be disposed on different partial regions of the upper surface of the insulating layer 168.

The spacer 199 takes the form of an empty space and may be adjusted in shape and size according to the size and height of the first electrode 170 and the second electrode 180. The spacer 199 may have no limit in terms of shape and size and may prevent, e.g., paste or solder from overflowing when the light emitting device 100 is attached using the paste or solder.

Figure 8:
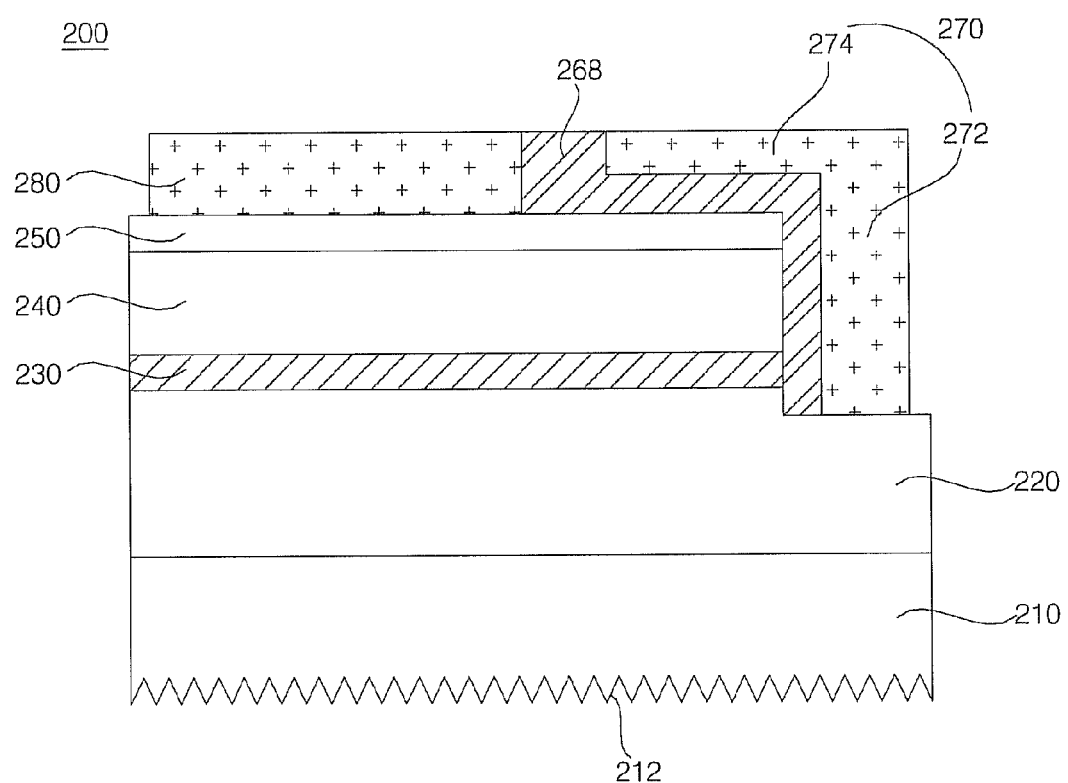
FIG. 8 is a sectional view showing a light emitting device in accordance with an alternative embodiment.

FIG. 8 is a sectional view showing a light emitting device in accordance with an alternative embodiment.

Referring to FIG. 8, as compared to the light emitting device of FIG. 3, the light emitting device 200 in accordance with the alternative embodiment has a difference in that an insulating layer 268 is provided.

The insulating layer 268 may be formed at least from between the lower electrode 272 and the lateral surfaces of the second semiconductor layer 240 and the active layer 230 to between the upper electrode 274 and the second semiconductor layer 240. The insulating layer 268 may contain a non-conductive organic material or inorganic material, for example, urethane, polyester or acryl, and may be formed in a single layer or in multiple layers, although the disclosure is not limited thereto.

To further prevent short circuit, the insulating layer 268 may extend up to the same line as the upper surfaces of the first electrode 270 and the second electrode 280.

Through use of the insulating layer 268, the light emitting device 200 is free from short circuit and may achieve enhanced reliability upon flip chip bonding.

Figure 9:
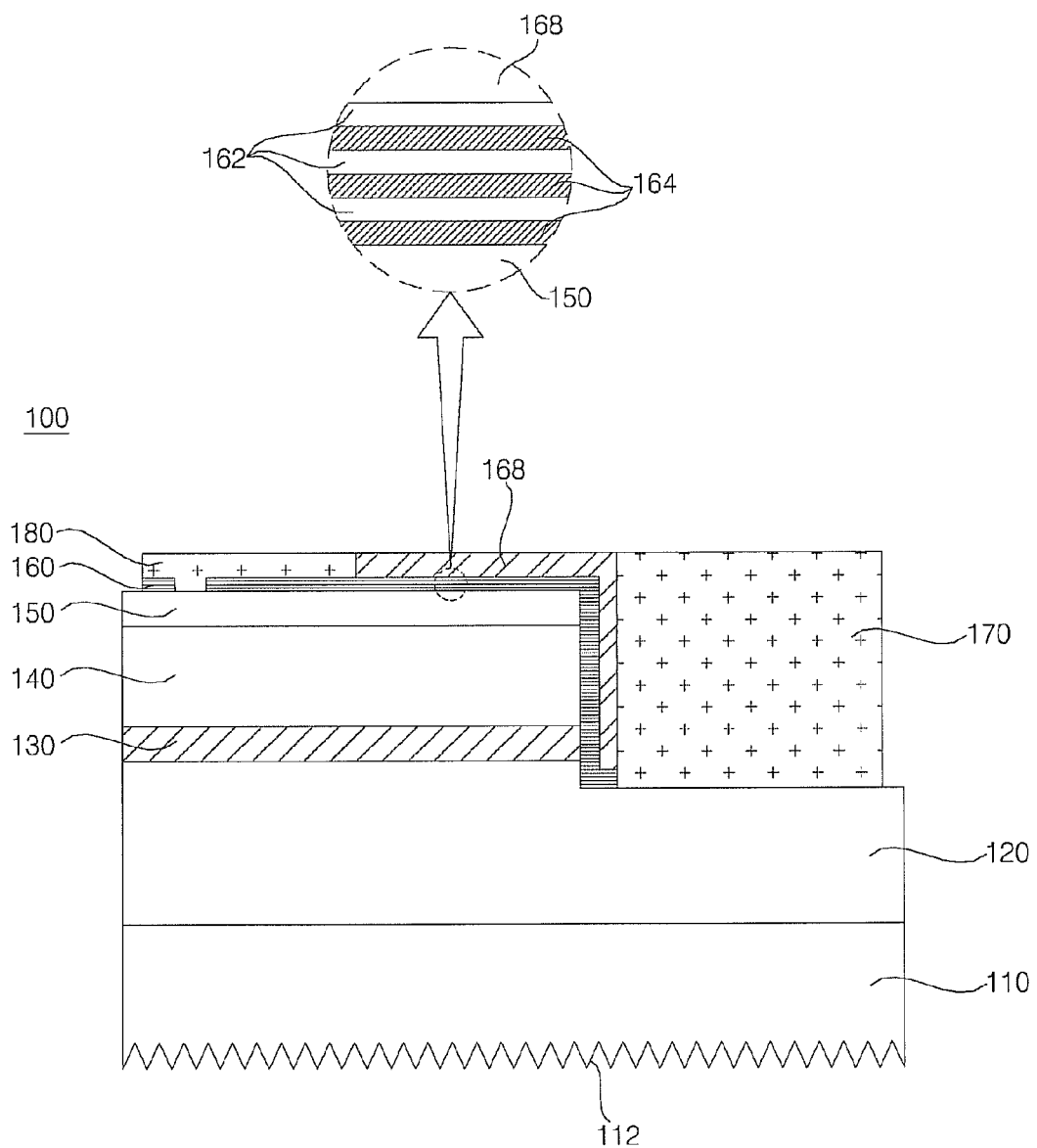
FIG. 9 is a sectional view showing a light emitting device in accordance with an alternative embodiment.

FIG. 9 is a sectional view showing a light emitting device in accordance with an alternative embodiment.

Referring to FIG. 9, as compared to the embodiment of FIG. 6, the light emitting device 100 in accordance with the alternative embodiment further includes a reflective layer 160 and has a difference in the configuration of the second electrode 180.

The reflective layer 160 may be disposed between the light transmittable electrode layer 150 and the second electrode 180. In this case, the second electrode 180 may be connected to the light transmittable electrode layer 150 through an opening of the reflective layer 160. That is, the light transmittable electrode layer 150 is disposed on the second semiconductor layer 140, the reflective layer 160 is disposed on the light transmittable electrode layer 150, the second electrode 180 is disposed on the reflective layer 160, and the second electrode 180 and the light transmittable electrode layer 150 are electrically connected to each other. Of course, the disclosure is not limited thereto, and the second electrode 180 and the light transmittable electrode layer 150 may be connected to each other via various methods.

Through use of the reflective layer 160, in the case in which the light emitting device 100 in accordance with the alternative embodiment is used of a flip chip type, it is possible to enhance light emission efficiency due to high reflectance of the reflective layer 160 and to ensure bonding stability and reliability due to an increased electrode area.

The reflective layer 160 may include first layers 162 having a first index of refraction and second layers 164 having a second index of refraction that is different from the first index of refraction. That is, the reflective layer 160 may have a configuration in which the layers 162 and 164 having different indices of refraction are alternately stacked one above another. In one example, the first layers 162 may be layers having a low index of refraction and the second layers 164 may be layers having a high index of refraction, although the disclosure is not limited thereto.

Assuming that "$\lambda$" is a wavelength of light emitted from the active layer 130, "n" is an index of refraction of a medium, and "m" is an odd number, the reflective layer 160 takes the form of a semiconductor stack in which the first layers 162 having a low index of refraction and the second layer 164 having a high index of refraction, which have a thickness of m $\lambda/4$n, are alternately stacked one above another to achieve a reflectance of 95% or more with respect to light of a particular wavelength band $\lambda$.

Accordingly, the first layers 162 having a low index of refraction and the second layers 164 having a high index of refraction may have a thickness of $\lambda/4$ times a reference wavelength. In this case, the thickness of each layer 162 and 164 may be in a range of 2 Å to 10 μm.

Each layer 162 or 164 of the reflective layer 160 may be formed of $M_xO_y$ or $M_xO_yN_z$ (M: Metal or Ceramic, O: Oxide, N: Nitride, X, Y, Z: constants).

In one example, the first layers 162 having a low index of refraction may be formed of SiO$_2$ having an index of refection of 1.4 or Al$_2$O$_3$ having an index of refection of 1.6, and the second layers 164 having a high index of refraction may be formed of TiO$_2$ having an index of refection of 2.0 or more, although the disclosure is not limited thereto.

Additionally, it is noted that a greater reflectance may be achieved by increasing an index of refraction of a medium between the first layer 162 having a low index of refraction and the second layer 164 having a high index of refraction.

The reflective layer 160 as described above has a greater band gap energy than an oscillation wavelength and exhibits less light absorption and consequently, greater light reflectance.

The reflective layer 160 may extend from the upper surface of the second semiconductor layer 140 to the upper surface of the first semiconductor layer 120 along the lateral surface of the second semiconductor layer 140 and the lateral surface of the active layer 130. Accordingly, light extraction efficiency may be maximized.

Figure 10:
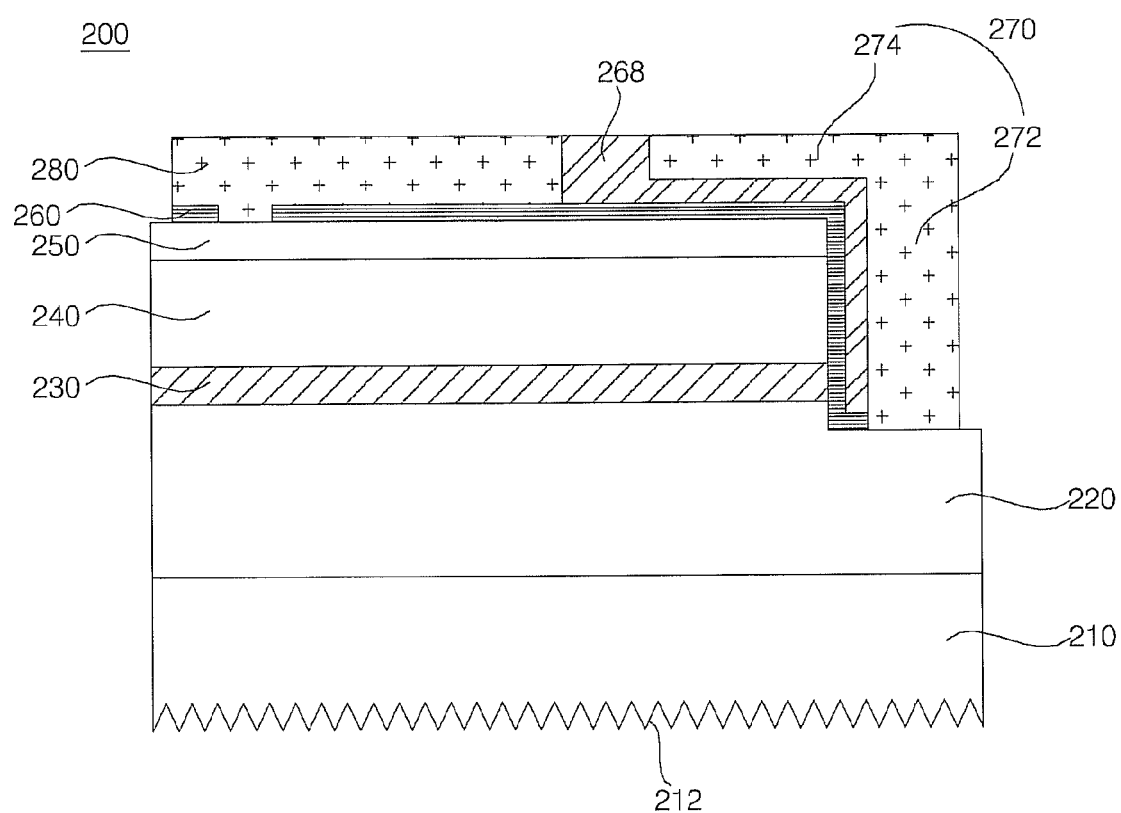
FIG. 10 is a sectional view showing a light emitting device in accordance with an alternative embodiment.

FIG. 10 is a sectional view showing a light emitting device in accordance with an alternative embodiment.

Referring to FIG. 10, as compared to the embodiment of FIG. 8, the light emitting device 200 in accordance with the embodiment further includes a reflective layer 260 and has a difference in the configuration of the second electrode 280.

The reflective layer 260 is disposed between the light transmittable electrode layer 250 and the second electrode 280. In this case, the second electrode 280 may be connected to the light transmittable electrode layer 250 through an opening of the reflective layer 260. Specifically, the light transmittable electrode layer 250 is disposed on the second semiconductor layer 240, the reflective layer 260 is disposed on the light transmittable electrode layer 250, the second electrode 280 is disposed on the reflective layer 260, and the second electrode 280 and the light transmittable electrode layer 250 are electrically connected to each other. Of course, the disclosure is not limited thereto, and the second electrode 280 and the light transmittable electrode layer 250 may be connected to each other via various methods.

Through use of the reflective layer 260, in the case in which the light emitting device 200 in accordance with the alternative embodiment is used in a flip chip type, it is possible to enhance light emission efficiency due to high reflectance of the reflective layer 260 and to ensure bonding stability and reliability due to an increased electrode area.

The configuration or material of the reflective layer 260 may be as described above.

Figure 11:
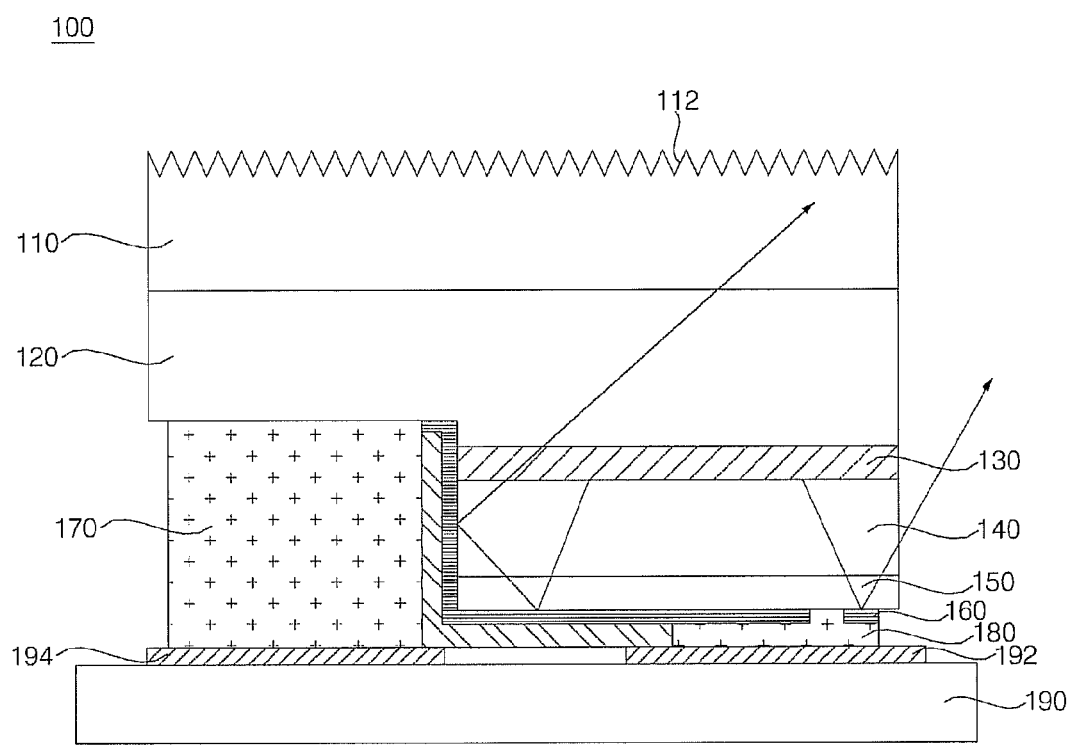
FIG. 11 is a view explaining emission of light in a configuration in which a light emitting device in accordance with an embodiment is flip chip bonded to a package substrate.

FIG. 11 is a sectional view showing emission of light in a configuration in which a light emitting device in accordance with an embodiment is flip chip bonded to a package substrate.

Hereinafter, the principle by which the light emitting device in accordance with the embodiment is flip chip bonded to achieve enhanced light extraction efficiency owing to the reflective layer 160 will be described in detail with reference to FIG. 11.

Referring to FIG. 11, the light emitting device 100 is illustrated as being flip chip bonded onto the package substrate 190. The conductor patterns 192 and 194 are formed on the package substrate 190 and are electrically connected to the second electrode 180 and the first electrode 170.

In the case of the flip chip type light emitting device, radiation is the most important problem as the brightness of the light emitting device increases. Thus, the wide area electrode, which exhibits effective radiation, may be suitable for a high brightness light emitting device.

The reflective layer 160 formed as described above serves not only to protect the light transmittable electrode layer 150 or the first semiconductor layer 120, but also to prevent light absorption and allow light to be directed to the support member 110, thereby enhancing light extraction efficiency of the light emitting device 100.

Specifically, as illustrated in FIG. 11, the light emitted from the active layer 130 is reflected by the reflective layer 160 to thereby be wholly directed to the support member 110, which may enhance light emission efficiency of the flip chip type light emitting device 100.

As a result of providing the electrode with a wide area, it may be possible to achieve bonding stability and reliability and to enhance light emission efficiency.

Figure 12:
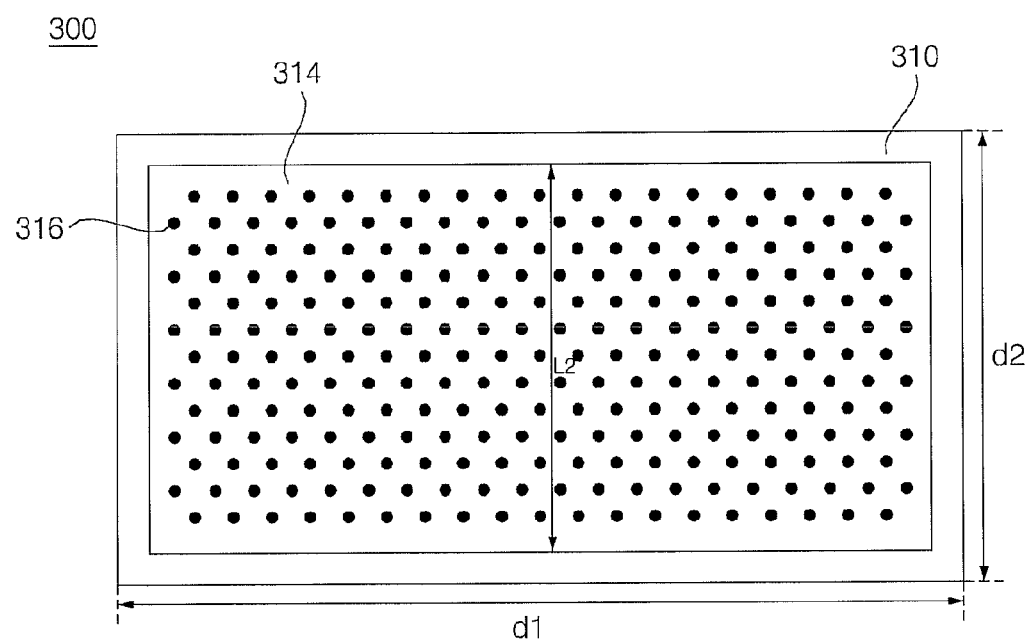
FIG. 12 is a bottom view showing a light emitting device in accordance with an alternative embodiment.
Figure 12:
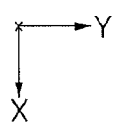
Figure 13:
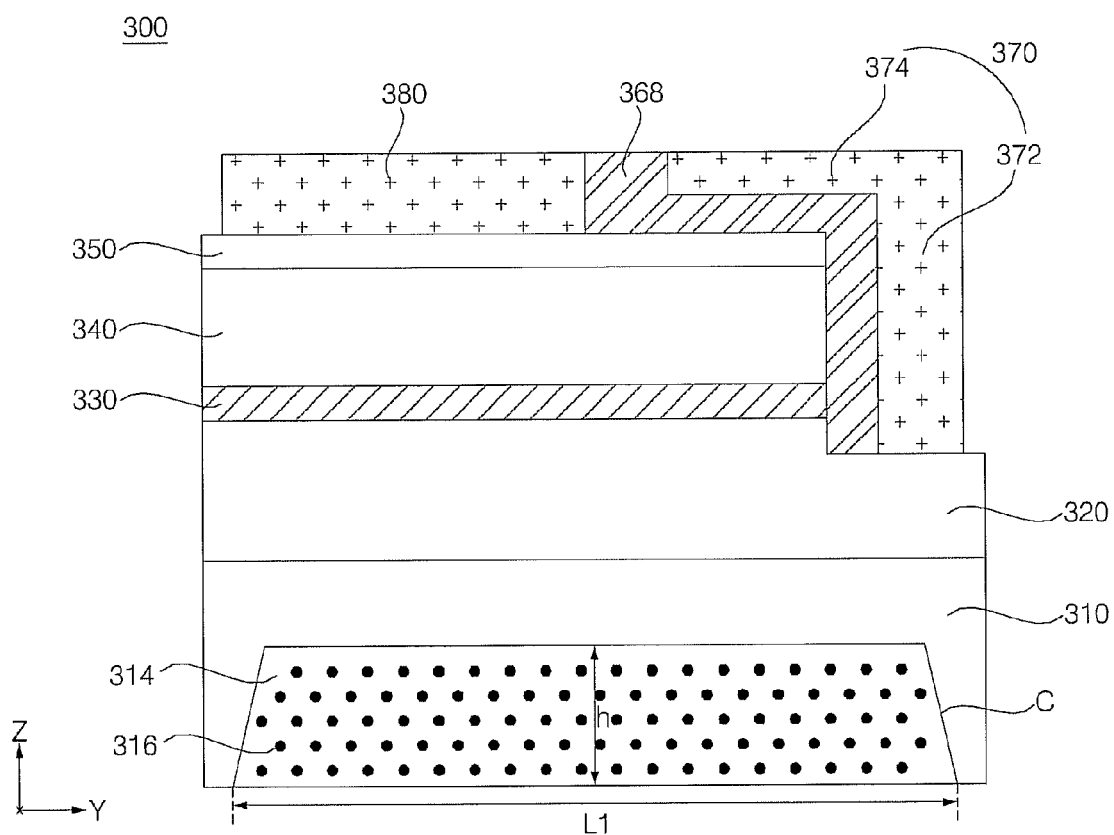
FIG. 13 is a sectional view of the light emitting device shown in FIG. 12.

FIG. 12 is a bottom view showing a light emitting device in accordance with an alternative embodiment, and FIG. 13 is a sectional view of the light emitting device shown in FIG. 12.

Referring to FIGS. 12 and 13, as compared to the embodiment of FIG. 8, the light emitting device 300 in accordance with the alternative embodiment includes a support member 310 having a cavity c and the cavity c is filled with a sealing material 314 containing a fluorescent substance 316.

The cavity c may have various shapes so long as it defines a predetermined space therein and for example, may have a tetragonal, polygonal or circular shape when viewed from the top. The cross section of the cavity c may have a cup shape, a concave container shape or the like, and an inner lateral surface of the cavity c may be perpendicular to or inclined from a bottom surface of the cavity c.

Also, the cavity c may have a circular shape, a tetragonal shape, a polygonal shape, an elliptical shape or the like when viewed from the front, although the disclosure is not limited thereto. Thus, the front shape of the cavity c may be freely selected.

If the cavity c has an excessively great depth h, it may deteriorate rigidity of the support member 310. If the cavity c has an excessively small depth h, it does not provide a sufficient space for white light excitation of light emitted from the active layer 330. Therefore, the depth h of the cavity c may be in a range of 0.3 to 0.7 times a thickness of the support member 310, although the disclosure is not limited thereto.

If the cavity c has an excessively great length L1 (along the Y-axis of the drawing), it may deteriorate rigidity of the support member 310. If the cavity c has an excessively small length L1, it does not provide a sufficient space for white light excitation of light emitted from the active layer 330 and causes deterioration in color rendering because light may be directed to a place where the cavity c is not present. Therefore, the length L1 of the cavity c may be in a range of 0.8 to 0.95 times a length of the support member 310, although the disclosure is not limited thereto.

If the cavity c has an excessively great width L2 (along the X-axis of the drawing), it may deteriorate rigidity of the support member 310. If the cavity c has an excessively small width L2, it does not provide a sufficient space for white light excitation of light emitted from the active layer 330 and causes deterioration in color rendering because light may be directed to a place where the cavity c is not present. Therefore, the width L2 of the cavity c may be in a range of 0.8 to 0.95 times the length of the support member 310, although the disclosure is not limited thereto.

The cavity c may be opened in the bottom of the support member 310 and may contain the sealing material 314. That is, the cavity c may be filled with and sealed by the sealing material 314.

If a length of the light emitting device 300 is much greater than a thickness of the light emitting device 300, this may cause manufacturing problems. If the length of the light emitting device 300 is too short, this may cause a great amount of light to be directed laterally and consequently, prevents the fluorescent substance 316 of the support member 310 from performing light excitation. Therefore, the length of the light emitting device 300 may be in a range of 6 to 12 times the thickness of the light emitting device 300, although the disclosure is not limited thereto.

The sealing material 314 may be a light transmittable resin material, such as silicon or epoxy. After the material is filled in the cavity c, the material may be subjected to ultraviolet or thermal curing, although the disclosure is not limited thereto.

The sealing material 314 may contain the fluorescent substance 316. The kind of the fluorescent substance 316 is selected according to the wavelength of light emitted from the active layer 330, so as to allow the light emitting device 300 to emit white light. Accordingly, the fluorescent substance 316 may include at least one selected from among, for example, red, blue and yellow fluorescent substances, and may include various kinds of fluorescent substances, although the disclosure is not limited thereto.

Specifically, the fluorescent substance may be excited by light having a first color that is emitted from the active layer 330 to thereby generate light having a second color. For example, if the light emitted from the active layer 330 is blue light and the fluorescent substance is a yellow fluorescent substance, the yellow fluorescent substance may emit white light by being excited by the blue light.

Similarly, if the light emitted from the active layer 330 is green light, use of a magenta fluorescent substance or a mixture of blue and red fluorescent substances may be exemplified, and if the light emitted from the active layer 330 is red light, use of a cyan fluorescent substance or a mixture of blue and green fluorescent substances may be exemplified.

The fluorescent substance 316 may be a known fluorescent substance, such as a YAG-based, TAG-based, sulfide-based, silicate-based, aluminate-based, nitride-based, carbide-based, nitridosilicate-based, borate-based, fluoride-based, phosphate-based fluorescent substance or the like.

In the case of a flip chip type light emitting device, radiation is the most important problem as the brightness of the light emitting device increases. As described above, in the case in which the support member 310 has the cavity c filled with the fluorescent substance 316, a light emitting device packaging process with relation to the sealing material and the fluorescent substance may be omitted, which advantageously shortens the entire process and increases radiation efficiency. Moreover, as a result of filling the sealing material 314 in the cavity c of the support member 310, the amount of the sealing material 314 may be easily adjusted and the sealing material 314 may achieve enhanced adhesion performance with the support member 310.

The sealing material 314 may further contain a light diffuser to diffuse light emitted from the active layer 330. The light diffuser may be any one of white metal oxides, such as titanium dioxide ($TiO_2$), barium oxide (BaO), silicon dioxide ($SiO_2$), magnesium oxide (MgO) and yttrium oxide ($Y_2O_3$), or may be a mixture of at least two selected from among titanium dioxide ($TiO_2$), barium oxide (BaO), silicon dioxide ($SiO_2$), magnesium oxide (MgO) and yttrium oxide ($Y_2O_3$). Through use of the light diffuser, irregular reflection of light emitted from the light emitting device may be induced.

Figure 14:
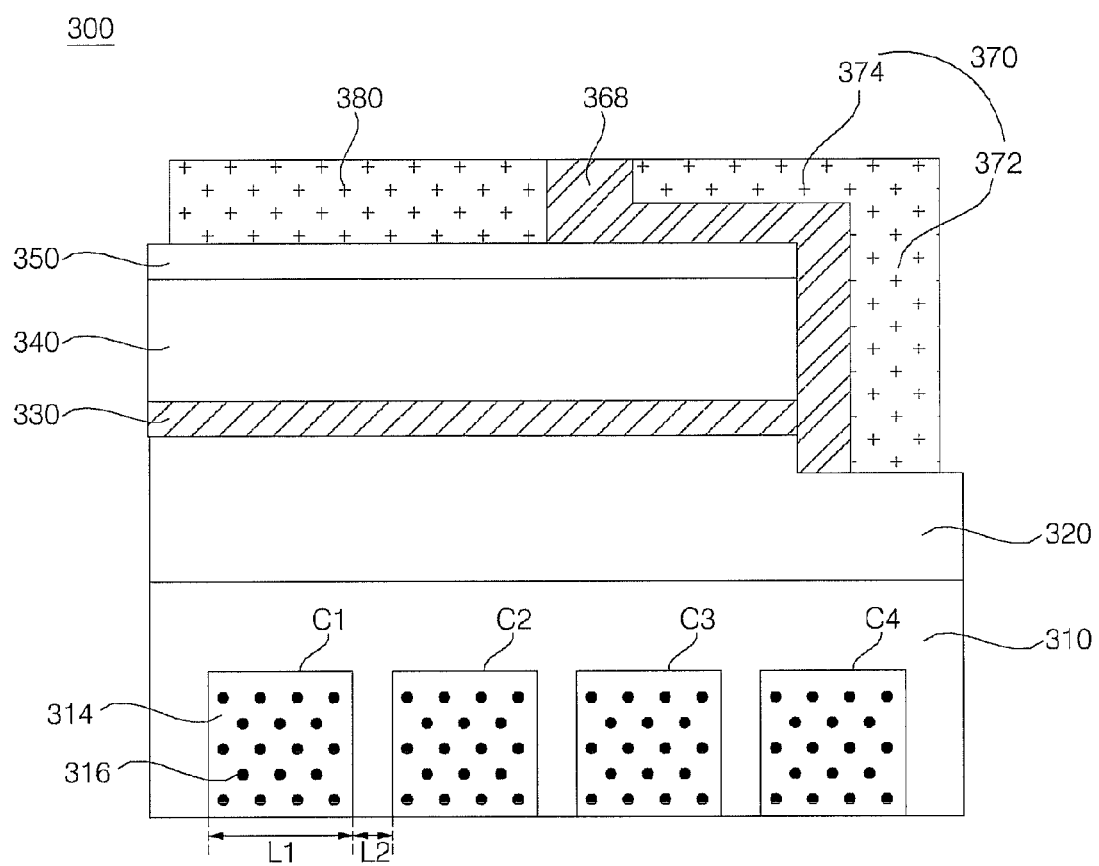
FIG. 14 is a sectional view showing a light emitting device in accordance with an alternative embodiment.

FIG. 14 is a sectional view showing a light emitting device in accordance with an alternative embodiment.

Referring to FIG. 14, as compared to the embodiment of FIG. 13, the light emitting device 300 in accordance with the alternative embodiment has a difference in that the support member 310 has a plurality of cavities c. Hereinafter, a description of the same constituent elements as those described above will be omitted.

Here, the cavity c is not limited to a specific number and may be prepared in various numbers according to the size and kind of the light emitting device 300 and the kind of light to be emitted.

A distance between neighboring cavities (e.g., $c1$, $c2$, $c3$) may be less than a length of the cavity c, although the disclosure is not limited thereto.

In the case in which the plurality of cavities c is formed, a difference in the index of refraction between a region having the cavities c and a region having no cavities causes irregular reflection, which may result in enhanced light emission efficiency and color rendering of the light emitting device 300.

The cavity c may have various shapes so long as it defines a predetermined space therein and for example, may have a tetragonal shape, a polygonal shape or a circular shape when viewed from the top. The cross section of the cavity c may have a cup shape, a concave container shape or the like, and an inner lateral surface of the cavity c may be perpendicular to or inclined from a bottom surface of the cavity c.

Also, the cavity c may have a circular shape, a tetragonal shape, a polygonal shape, an elliptical shape or the like when viewed from the front, although the disclosure is not limited thereto. Thus, the front shape of the cavity c may be freely selected.

Figure 15:
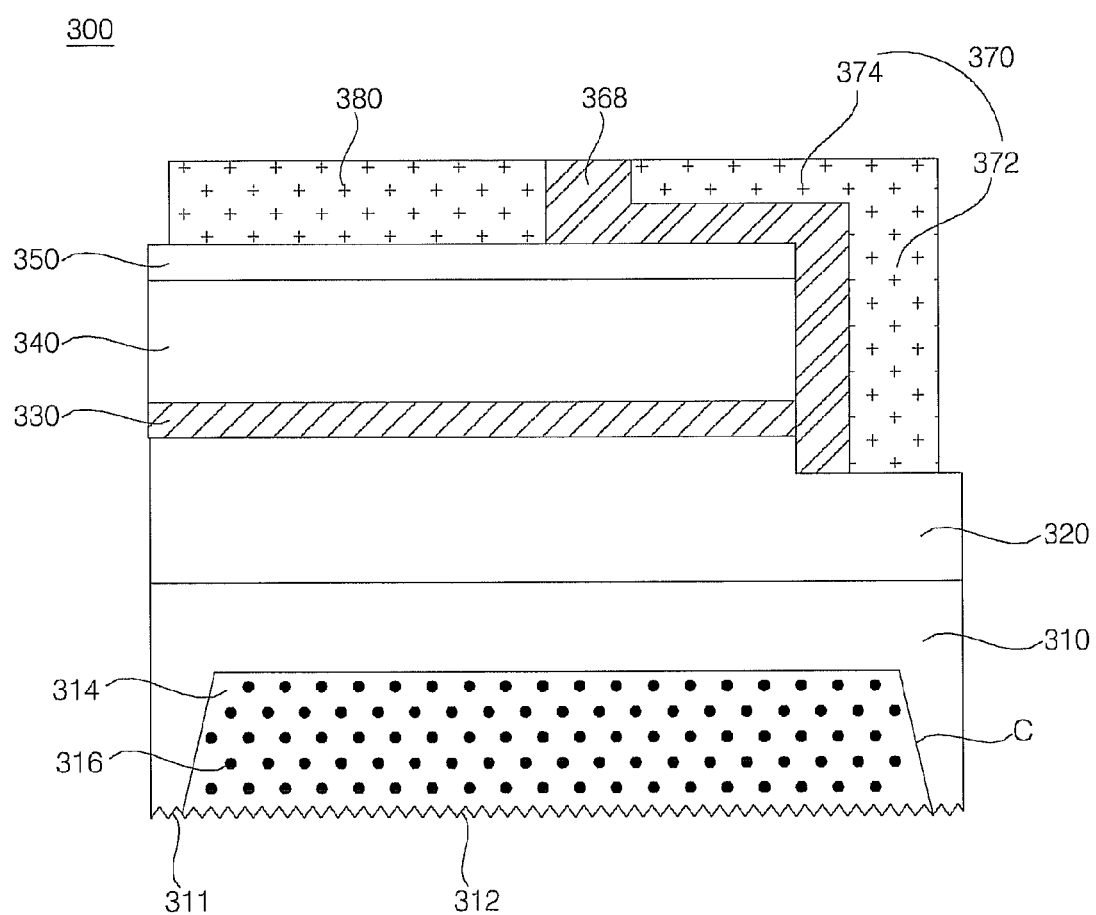
FIG. 15 is a sectional view showing a light emitting device in accordance with an alternative embodiment.
Figure 16:
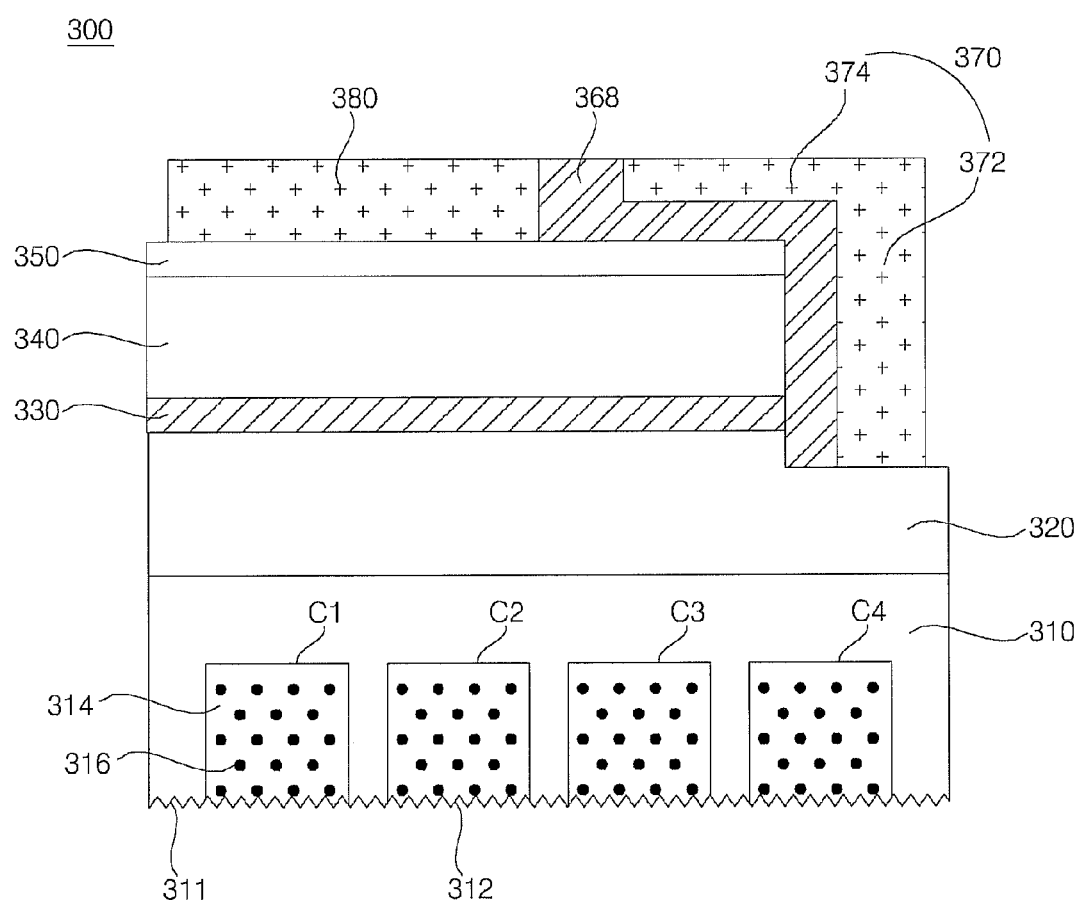
FIG. 16 is a sectional view showing a light emitting device in accordance with an alternative embodiment.

FIG. 15 is a sectional view showing a light emitting device in accordance with an alternative embodiment, and FIG. 16 is a sectional view showing a light emitting device in accordance with an alternative embodiment.

Referring to FIG. 15, as compared to the embodiment of FIG. 13, the light emitting device 300 in accordance with the alternative embodiment is configured in such a way that uneven patterns 311 and 312 may be formed at a lower surface of the support member 310 or the cavity c.

The uneven patterns 311 and 312 may be an arrangement of a plurality of semi-spheres, cones and cylinders, which may be arranged regularly or irregularly. The uneven patterns 311 and 312 may be formed by etching, more particularly, dry etching or wet etching, although the disclosure is not limited thereto.

The uneven patterns 311 and 312 serve to induce irregular reflection of light emitted from the active layer 330, thereby enhancing color rendering of the light emitting device 300 and achieving enhanced light extraction efficiency by preventing total reflection of light.

Referring to FIG. 16, as compared to the embodiment of FIG. 14, the light emitting device 300 in accordance with the alternative embodiment is configured in such a way that uneven patterns 311 and 312 may be formed at a lower surface of the support member 310 or the cavity c.

The uneven patterns 311 and 312 are those as described in FIG. 3. The uneven patterns 311 and 312 induce irregular reflection of light emitted from the active layer 330, thereby enhancing color rendering of the light emitting device 300 and achieving enhanced light extraction efficiency by preventing total reflection of light. Additionally, the uneven patterns 311 and 312 may enhance light emission efficiency, FIG. 17 is a sectional view showing a light emitting device in accordance with an alternative embodiment.

Figure 17:
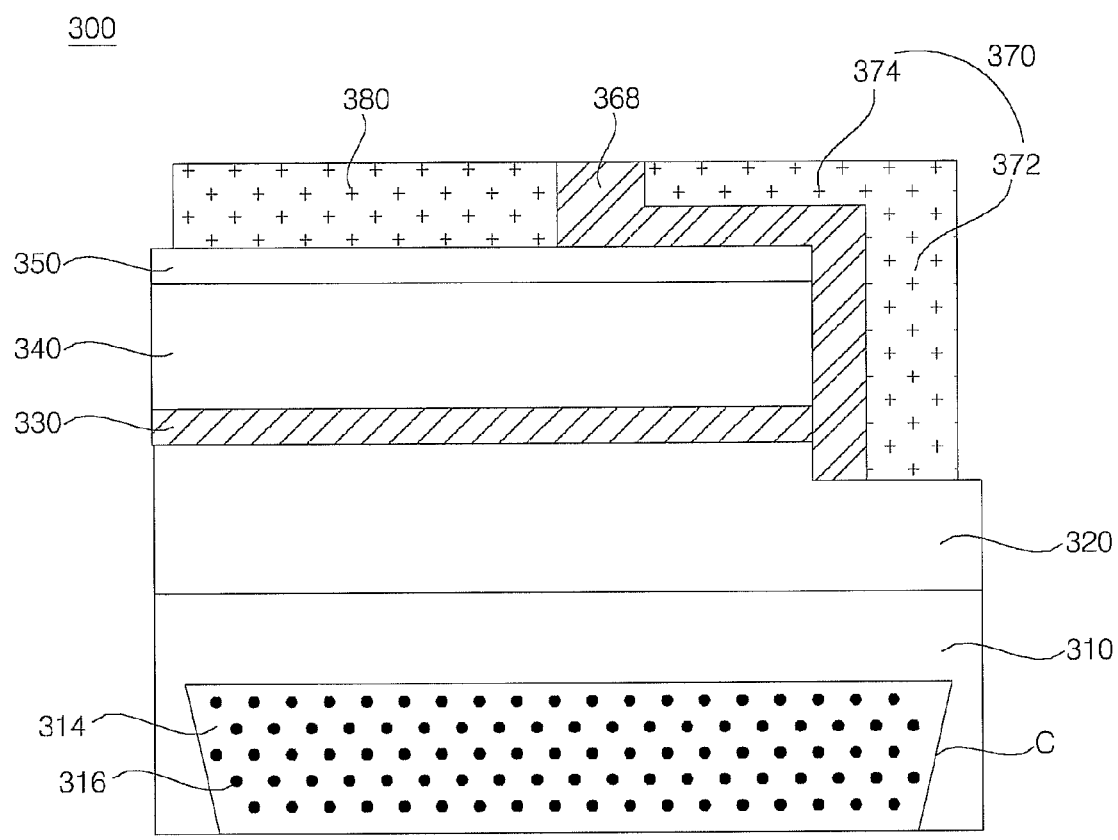
FIG. 17 is a sectional view showing a light emitting device in accordance with an alternative embodiment.

Referring to FIG. 17, as compared to the embodiment of FIG. 13, the light emitting device 300 in accordance with the alternative embodiment has a difference in the shape of a lateral surface of the cavity c. Specifically, the length of the cavity c may increase with decreasing distance to a lower surface of the first semiconductor layer 320.

More specifically, as illustrated in FIG. 17, the length of the cavity c may increase with decreasing distance to the lower surface of the first semiconductor layer 320, thereby providing the cavity c with an inverted trapezoidal cross section.

In FIG. 17, although the lateral surface of the cavity c is illustrated as having a linear shape, it may have a curvilinear shape or curved surface shape or may be stepped. However, the disclosure is not limited thereto.

Through use of the cavity c, it may be possible to prevent the sealing material 314 from being separated from the support member 310. Also, increasing the length of the cavity c with decreasing distance to the active layer 330 is advantageous to realize white light, and reducing the length of the cavity c at the bottom of the support member 310 may minimize deterioration in the rigidity of the support member 310.

Figure 18:
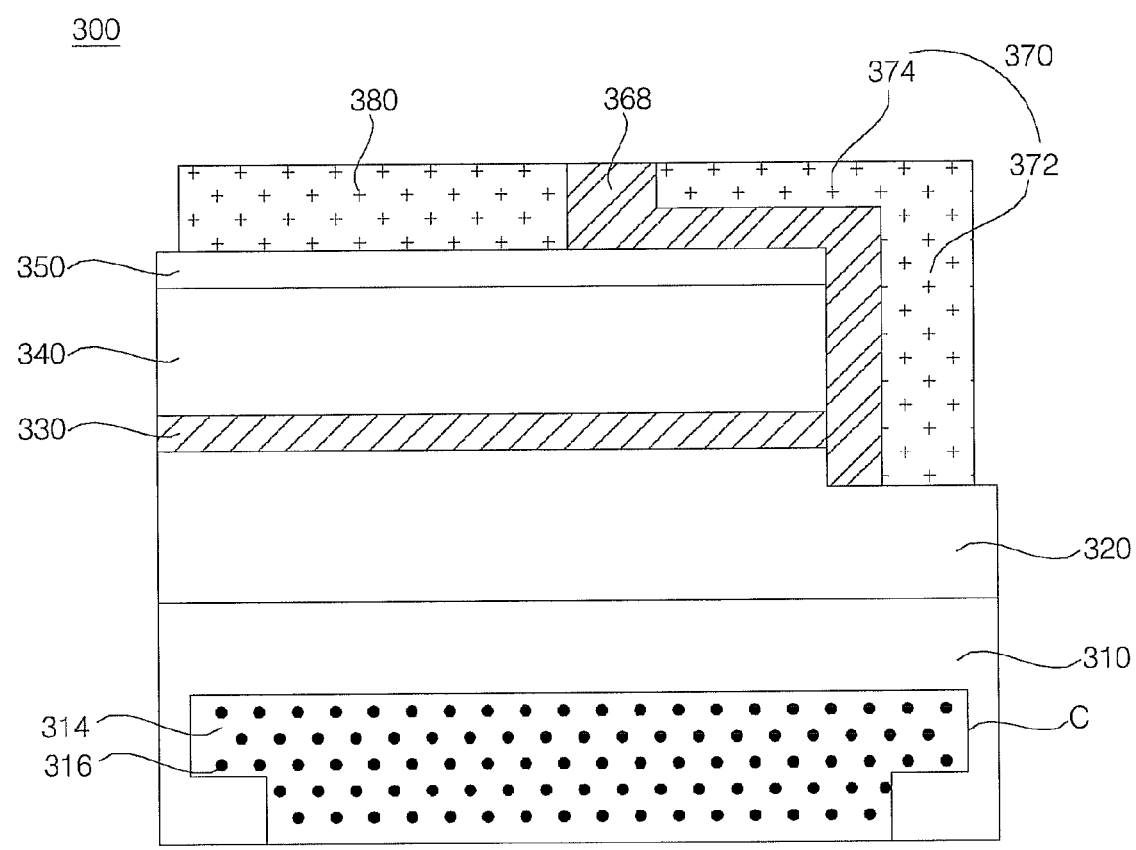
FIG. 18 is a sectional view showing a light emitting device in accordance with an alternative embodiment.

FIG. 18 is a sectional view showing a light emitting device in accordance with an alternative embodiment.

Referring to FIG. 18, as compared to the embodiment of FIG. 17, the light emitting device 300 in accordance with the embodiment has a difference in the shape of the lateral surface of the cavity c. Specifically, the lateral surface of the cavity c may be stepped.

More specifically, as illustrated in FIG. 18, the length of the cavity c increases with decreasing distance to the lower surface of the first semiconductor layer 320 and the lateral surface of the cavity c may be stepped.

With regard to the stepped lateral surface, the number of steps is not limited and may be determined according to the size and kind of the light emitting device. Also, the steps may have a curvilinear shape or curved surface shape, although the disclosure is not limited thereto.

Through use of the cavity c, it may be possible to prevent the sealing material 314 from being separated from the support member 310. Also, increasing the length of the cavity c with decreasing distance to the active layer 330 is advantageous to realize white light, and reducing the length of the cavity c at the bottom of the support member 310 may minimize deterioration in the rigidity of the support member 310. Moreover, providing the cavity c with the stepped lateral surface may further prevent separation of the sealing material 314 from the support member 310.

Figure 19:
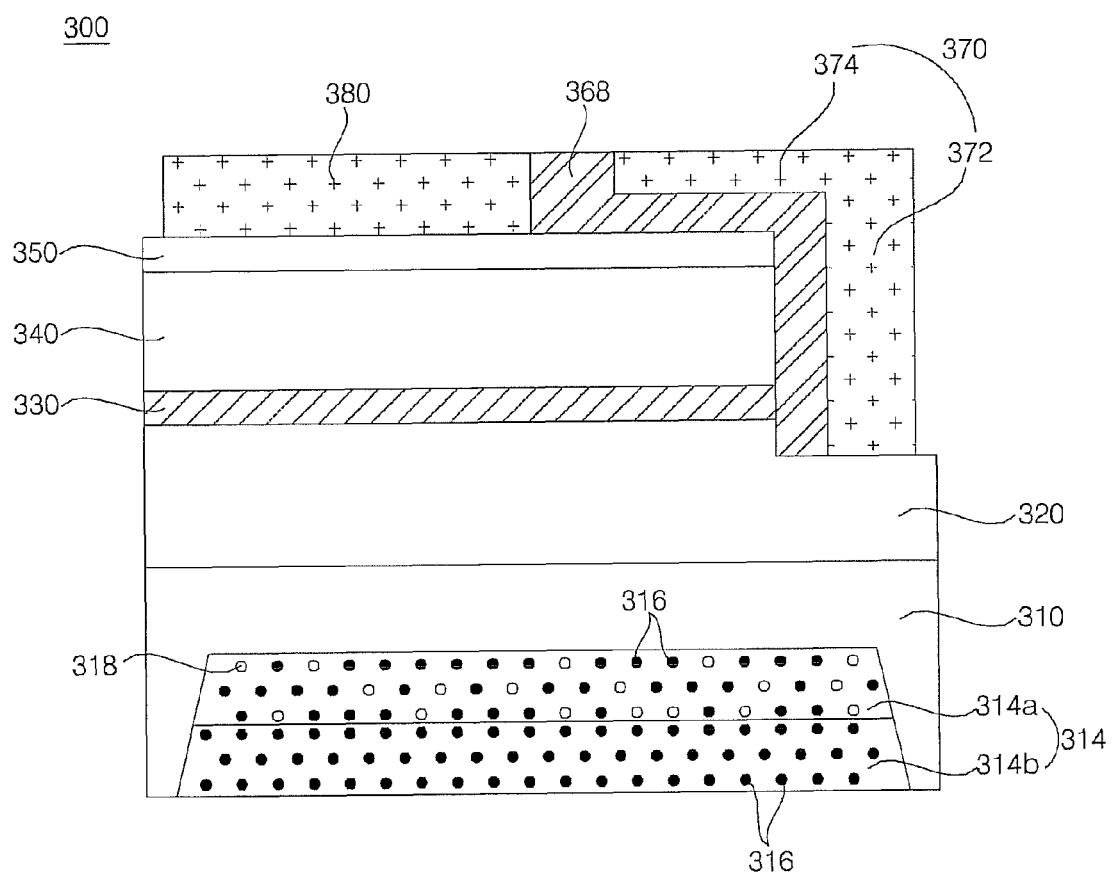
FIG. 19 is a sectional view showing a light emitting device in accordance with an alternative embodiment.

FIG. 19 is a sectional view showing a light emitting device in accordance with an alternative embodiment.

Referring to FIG. 19, as compared to the embodiment of FIG. 13, the light emitting device 300 in accordance with the embodiment has a difference in that the sealing material 314 may include a first sealing material 314a stacked on the bottom of the cavity c and a second sealing material 314b stacked on the first sealing material 314a.

The first sealing material 314a may contain a light diffuser 318 to diffuse light to be emitted from the light emitting device 300. Both the first sealing material 314a and the second sealing material 314b may contain the fluorescent substance 316. Through use of the light diffuser 318, it may be possible to further enhance color rendering of light emitted from the active layer 330.

Figure 20:
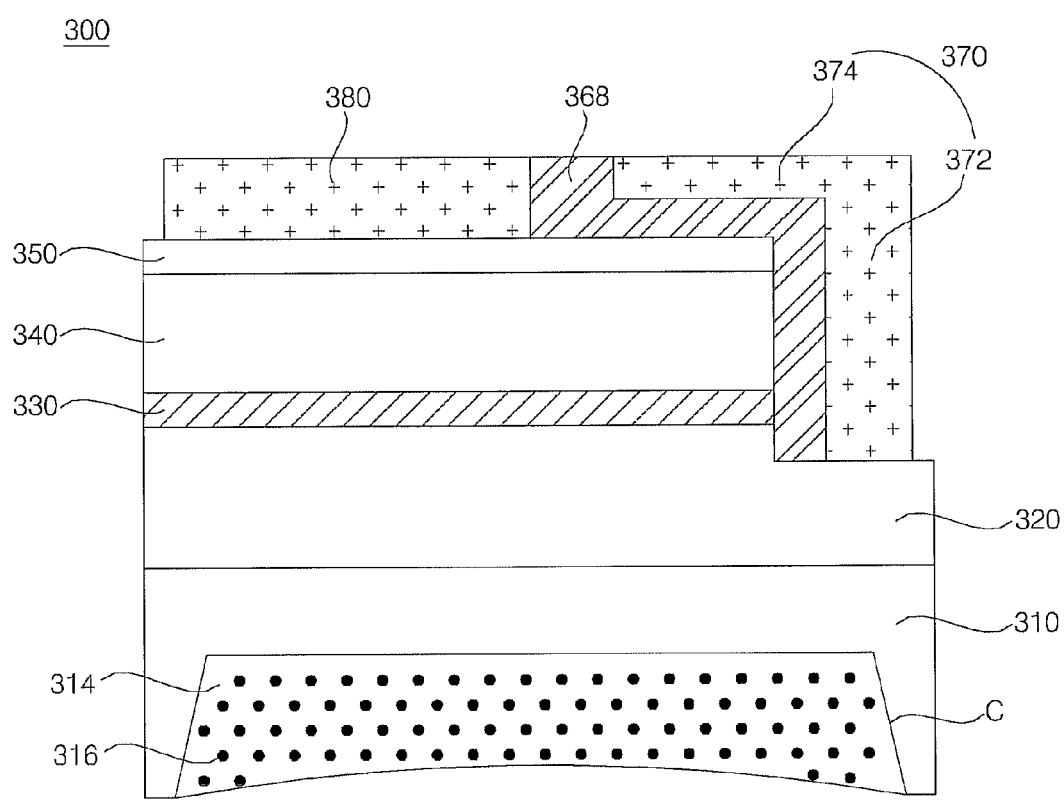
FIG. 20 is a sectional view showing a light emitting device in accordance with an alternative embodiment.

FIG. 20 is a sectional view showing a light emitting device in accordance with an alternative embodiment.

Referring to FIG. 20, as compared to the embodiment of FIG. 13, the light emitting device 300 in accordance with the embodiment may have a difference in that a lower surface of the sealing material 314 may be centrally concave.

If the center of the sealing material 314 has a concave shape, the sealing material 314 may act as a lens to reduce an irradiation angle of light emitted from the active layer 330, which may enhance concentration of the light.

Figure 21:
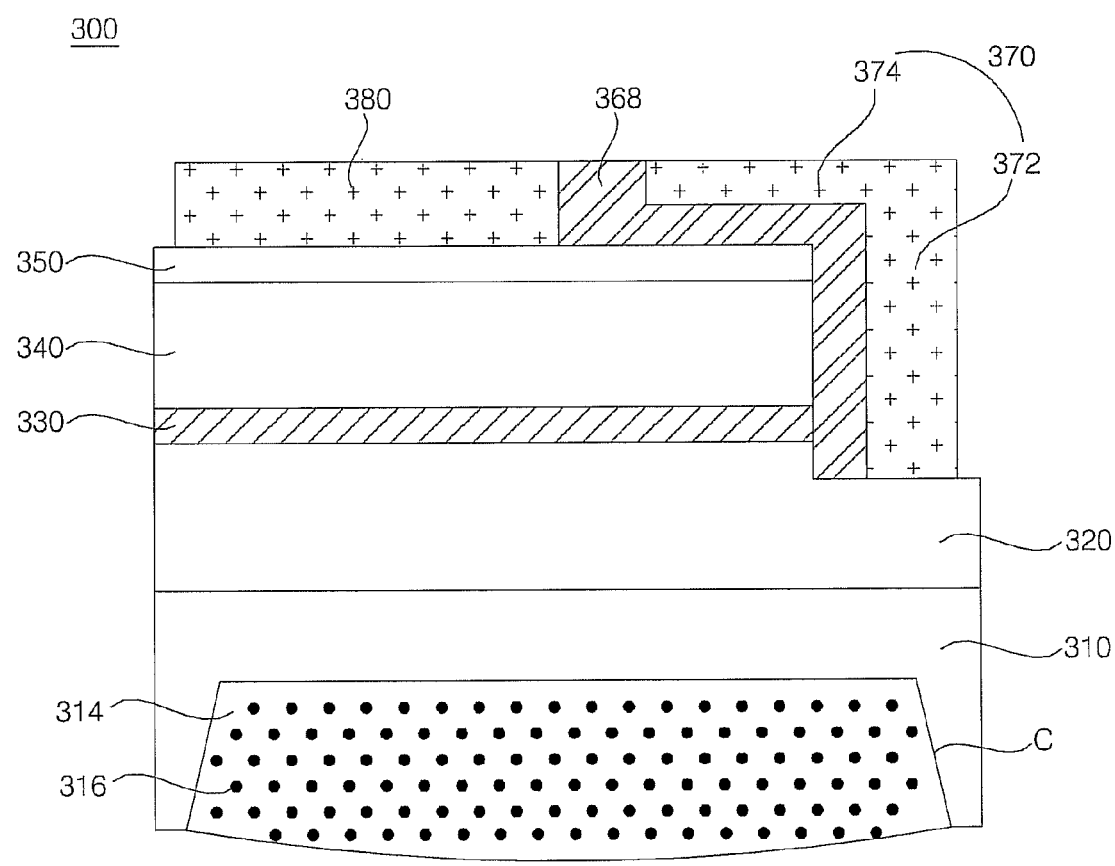
FIG. 21 is a sectional view showing a light emitting device in accordance with an alternative embodiment.

FIG. 21 is a sectional view showing a light emitting device in accordance with an alternative embodiment.

Referring to FIG. 21, as compared to the embodiment of FIG. 13, the light emitting device 300 in accordance with the alternative embodiment has a difference in that the lower surface of the sealing material 314 may be centrally convex.

If the center of the sealing material 314 has a convex shape, the sealing material 314 may act as a lens to increase an irradiation angle of light emitted from the active layer 330, which may enhance diffusion of the light.

Figure 22:
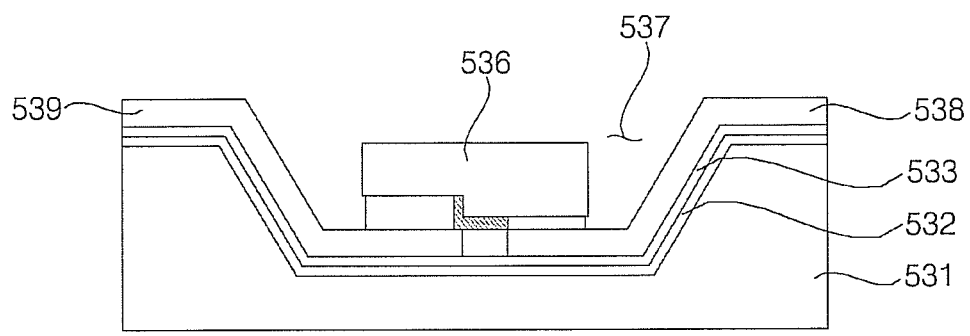
FIG. 22 is a sectional view of a light emitting device package including a light emitting device in accordance with an embodiment.

FIG. 22 is a sectional view of a light emitting device package including a light emitting device in accordance with an embodiment.

Referring to FIG. 22, the light emitting device package 500 in accordance with the embodiment may include a body 531, a first electrode layer 538 and a second electrode layer 539 mounted on the body 531, and a light emitting device 536 mounted on the body 531 and electrically connected to the first electrode layer 538 and the second electrode layer 539. The light emitting device 536 may be connected in a flip chip manner to the first electrode layer 538 and the second electrode layer 539.

The body 531 may be formed of a silicon material, a synthetic resin material or a metal material, and the light emitting device 536 may be surrounded by an inclined surface.

The first electrode layer 538 and the second electrode layer 539 are electrically separated from each other and serve to supply power to the light emitting device 536. The first electrode layer 538 and the second electrode layer 539 may serve not only to reflect light emitted from the light emitting device 536, thereby increasing light emission efficiency, but also to discharge heat generated from the light emitting device 536 to the outside.

A reflective layer 532 may be formed on the body 531, to more effectively concentrate light emitted from the light emitting device 536 forward. In general, the reflective layer 532 may be formed of a metal having a high coefficient of reflection, such as silver (Ag), aluminum (Al) and the like. In this case, to prevent electric contact with the electrode layers 538 and 539, an insulating layer 533 may further be formed on the reflective layer 532.

A cavity 537 is formed in the body 531 such that the light emitting diode 536 is bonded in the cavity 537. The cavity 537 may be filled with a molding member to enclose and protect the light emitting diode 536. The molding member may contain a fluorescent substance to change a wavelength of light emitted from the light emitting device 536.

Accordingly, owing to a wide area of the electrode layers, it may be possible to enhance bonding stability and reliability of the light emitting device 536 and to minimize deterioration in the light emission efficiency of the light emitting device 536. Further, the light emitting device 536 may be directly bonded using paste without bumps.

Figure 23:
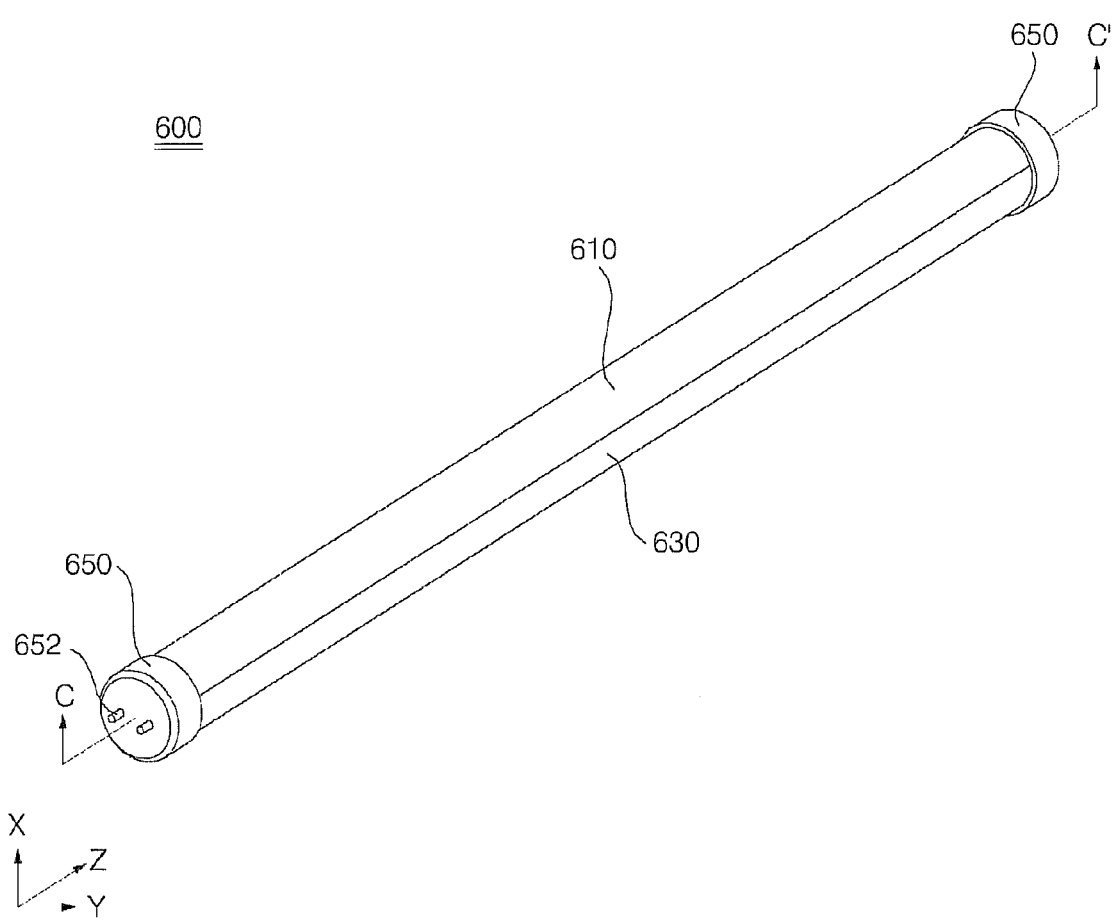
FIG. 23 is a perspective view showing a lighting apparatus including a light emitting device package in accordance with an embodiment.
Figure 24:
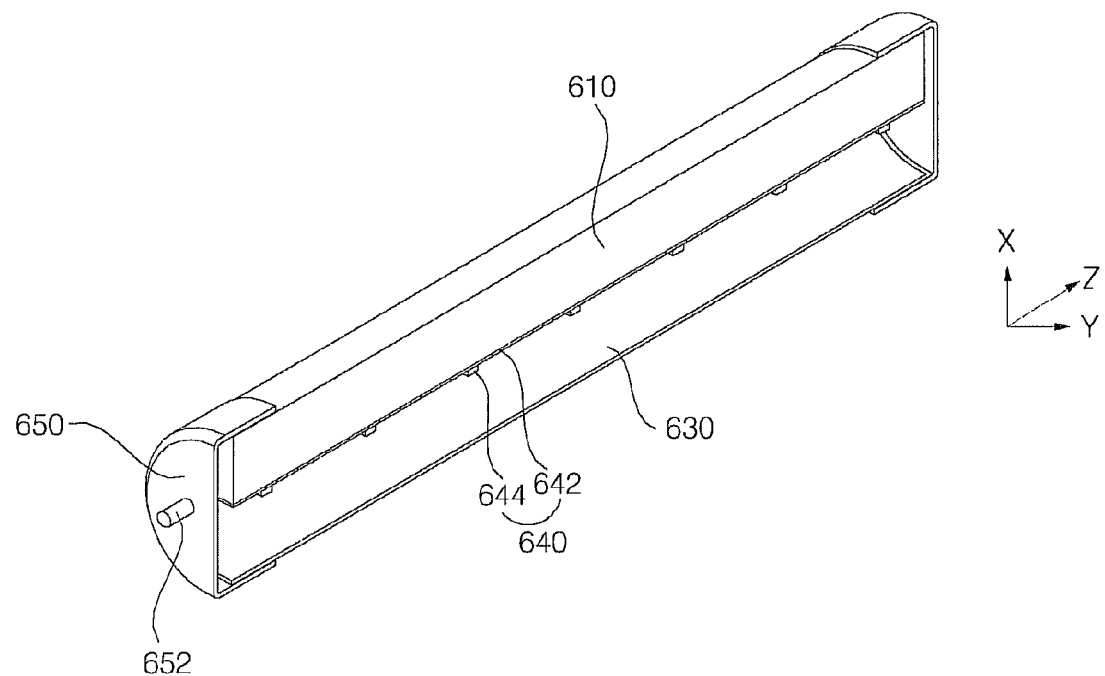
FIG. 24 is a sectional view taken along the line C-C' of the lighting apparatus shown in FIG. 23.

FIG. 23 is a perspective view showing a lighting apparatus including a light emitting device package in accordance with an embodiment, and FIG. 24 is a sectional view taken along the line C-C' of the lighting apparatus shown in FIG. 23.

Referring to FIGS. 23 and 24, the lighting apparatus 600 may include a body 610, a cover 630 coupled to the body 610, and end caps 650 disposed at opposite ends of the body 610.

A light emitting device module 640 may be coupled to a lower surface of the body 610. The body 610 may be formed of a metal material having excellent conductivity and heat radiation effects, to discharge heat generated in light emitting device packages 644 to the outside through an upper surface of the body 610.

The light emitting device packages 644 may have multiple colors and may be arranged in multiple rows on a printed circuit board 642 to form an array. Also, the light emitting device packages 644 may be arranged by the same distance or by different distances as occasion demands, to enable adjustment of brightness. The printed circuit board 642 may be formed of a Metal Core PCB (MCPCB), FR4PCB or the like.

The light emitting device packages 644 may include a lead frame (not shown) to have an enhanced radiation function. Therefore, the reliability and efficiency of the light emitting device packages 644 may be enhanced, and the lifespan of the lighting apparatus 600 including the light emitting device packages 644 as well as the lifespan of the light emitting device packages 644 may be extended.

The cover 630 may have a circular shape to surround the lower surface of the body 610, although the disclosure is not limited thereto.

The cover 630 protects the light emitting device module 640 from external foreign substances, etc. The cover 630 may contain diffusive particles to prevent glare of light emitted from the light emitting device packages 644 and to ensure uniform emission of light to the outside. A prism pattern may be formed on at least one of an inner surface and an outer surface of the cover 630. Additionally, a fluorescent substance may be applied to at least one of the inner surface and the outer surface of the cover 630.

As the light emitted from the light emitting device packages 644 is discharged to the outside through the cover 630, the cover 630 must have not only excellent light transmittance, but also heat resistance sufficient to endure heat generated from the light emitting device packages 644. The cover 630 may be formed of Polyethylene Terephthalate (PET), Polycarbonate (PC), PolymethylMethacrylate (PMMA) or the like.

The end caps 650 may be disposed at opposite ends of the body 610 and serve to hermetically seal a power device (not shown). The end caps 650 may be provided with power pins 652, which allows the lighting apparatus 600 in accordance with the embodiment to be directly used in a terminal, from which an existing fluorescent lamp has been removed, without requiring a separate device.

Figure 25:
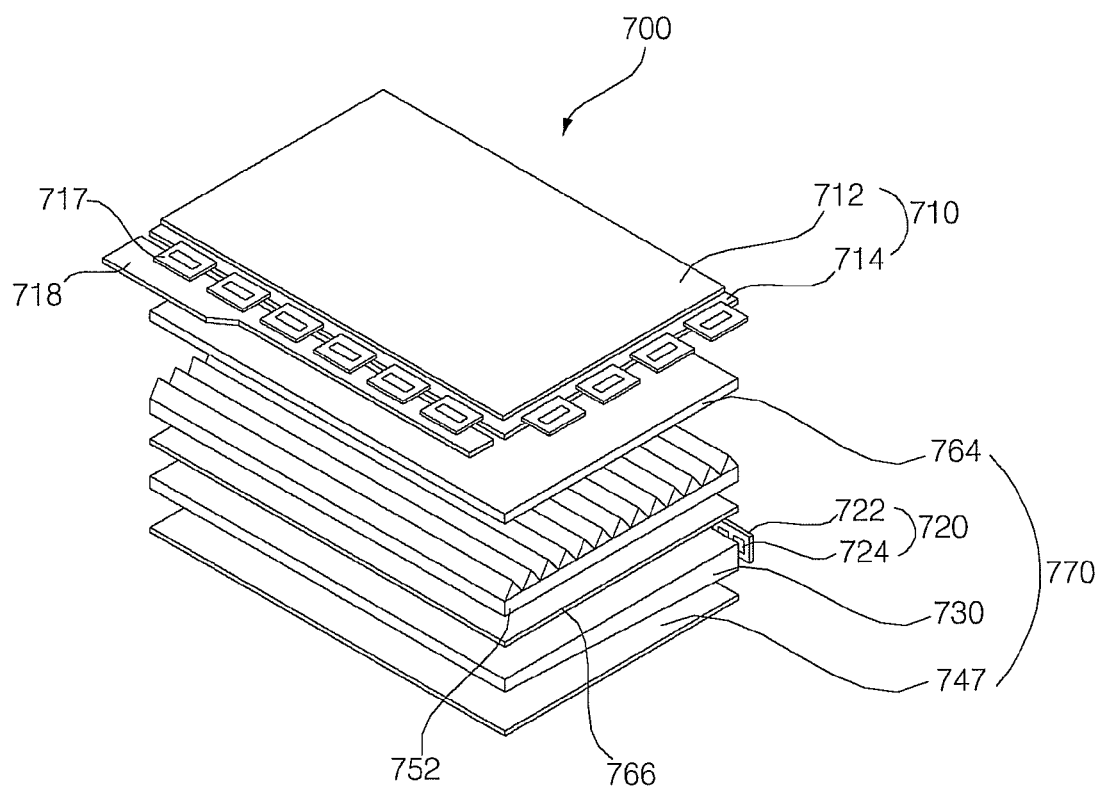
FIG. 25 is an exploded perspective view of a liquid crystal display apparatus including a light emitting device in accordance with an embodiment.

FIG. 25 is an exploded perspective view of a liquid crystal display apparatus including a light emitting device in accordance with an embodiment.

FIG. 25 illustrates an edge light type liquid crystal display apparatus 700, which may include a liquid crystal display panel 710 and a backlight unit 770 to irradiate light to the liquid crystal display panel 710.

The liquid crystal display panel 710 may display an image using light generated from the backlight unit 770. The liquid crystal display panel 710 may include a color filter substrate 712 and a thin film transistor substrate 714, which are arranged to face each other with liquid crystals interposed therebetween.

The color filter substrate 312 may realize the color of the image displayed via the liquid crystal display panel 710.

The thin film transistor substrate 714 is electrically connected to a printed circuit board 718, on which a plurality of circuit elements is mounted, by means of a drive film 717. The thin film transistor substrate 714 may apply drive voltage, provided by the printed circuit board 718, to the liquid crystals in response to a drive signal transmitted from the printed circuit board 718.

The thin film transistor substrate 714 may include pixel electrodes and thin film transistors in the form of thin films formed on another substrate formed of a transparent material, such as glass, plastic or the like.

The backlight unit 770 includes a light emitting device module 720 to emit light, a light guide plate 730 to change light emitted from the light emitting device module 720 into planar light and transmit the planar light to the liquid crystal display panel 710, a plurality of films 750, 760 and 764 to achieve uniformity in brightness distribution and improve vertical light incidence of the light having passed through the light guide plate 730, and a reflective sheet 740 to reflect light, emitted rearward from the light guide plate 730, toward the light guide plate 730.

The light emitting device module 720 may include a plurality of light emitting device packages 724 and a printed circuit board 722 on which the plurality of light emitting device packages 724 is mounted to define an array.

The backlight unit 770 may include a diffusive film 766, which diffuses incident light from the liquid guide plate 730 toward the liquid display panel 710, and a prism film 750 which condenses the diffused light to enhance vertical incidence. The prism film 750 may include a protective film 764 to protect the prism film 750.

Figure 26:
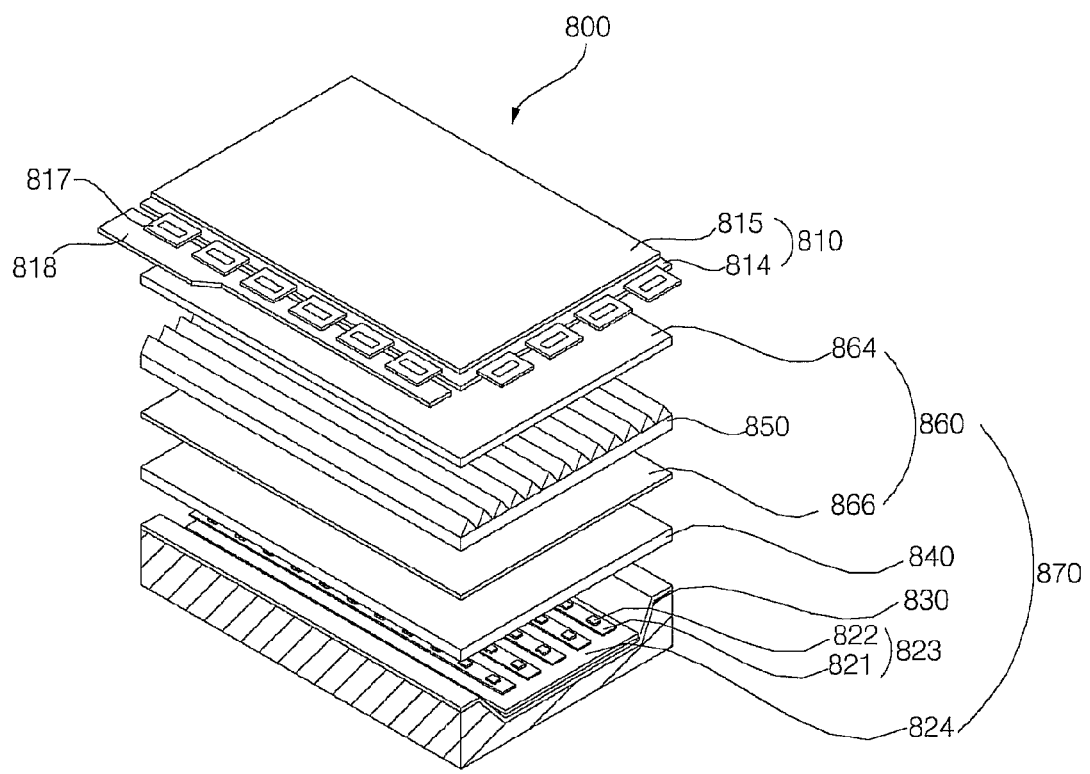
FIG. 26 is an exploded perspective view of a liquid crystal display apparatus including a light emitting device in accordance with an embodiment.

FIG. 26 is an exploded perspective view of a liquid crystal display apparatus including a light emitting device in accordance with an embodiment. The same configuration as that illustrated and described in FIG. 25 will not be repeated hereinafter.

FIG. 26 illustrates a vertical type liquid crystal display apparatus 800, which may include a liquid crystal display panel 810 and a backlight unit 870 to irradiate light to the liquid crystal display panel 810.

The liquid crystal display panel 810 is identical to the description with reference to FIG. 25 and thus, a detailed description thereof will be omitted.

The backlight unit 870 may include a plurality of light emitting device modules 823, a reflective sheet 824, a lower chassis 830 in which the light emitting device modules 823 and the reflective sheet 824 are accommodated, a diffusive plate 840 and a plurality of optical films 860 disposed above the light emitting device modules 823.

Each of the light emitting device modules 823 may include a plurality of light emitting device packages 822 and a printed circuit board 821 on which the plurality of light emitting device packages 822 is mounted to form an array.

The reflective sheet 824 serves to reflect light emitted from the light emitting device packages 822 toward the liquid crystal display panel 810, thereby improving use efficiency of the light.

The light emitted from the light emitting device modules 823 is introduced into the diffusive plate 840, and optical films 860 are disposed above the diffusive plate 840. The optical films 860 may include a diffusive film 866, a prism film 850 and a protective film 864.

As is apparent from the above description, the embodiments provide a flip chip type light emitting device, which achieves enhanced light emission efficiency as well as stability and reliability upon bonding to a light emitting device package.

The flip chip type light emitting device does not need separate bumps upon bonding, which may result in reduction in production costs and time.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device package comprising a light emitting device, wherein the light emitting device includes:
   a support member;
   a light emitting structure including a first semiconductor layer disposed on the support member, a second semiconductor layer and an active layer between the first semiconductor layer and the second semiconductor layer;
   a first electrode disposed on the first semiconductor layer in a first region through which the first semiconductor layer is exposed;
   a second electrode disposed on the second semiconductor layer;
   an insulating layer disposed at least between the first electrode and the second electrode;
   a light transmittable electrode layer disposed between the second semiconductor layer and the second electrode; and
   a reflective layer between the light transmittable electrode layer and the second electrode, and the light emitting structure,
   wherein the first semiconductor layer is a different layer than the second semiconductor layer, the active layer includes at least one pair of a well layer and a barrier layer, and a band gap of the well layer is less than a band gap of the barrier layer, and
   wherein an area of an upper surface of the first electrode is in a range of 40% to 90% of an area of the second semiconductor layer,
   wherein the reflective layer is formed from an upper surface of the second semiconductor layer to an upper surface of the first semiconductor layer along a lateral surface of the second semiconductor layer and a lateral surface of the active layer,
   wherein the reflective layer includes at least a first layer having a first index of refraction and a second layer having a second index of refraction that is different from the first index of refraction,
   wherein the first layer and the second layer of the reflective layer are alternately and repeatedly stacked one above another,
   wherein the first layer comprises $SiO_2$ or $Al_2O_3$,
   wherein the second layer comprises $TiO_2$, and
   wherein the second electrode is connected to the light transmittable electrode layer through an opening of the reflective layer.

2. The light emitting device package according to claim 1, wherein the second electrode has an area in a range of 40% to 99% of the area of the second semiconductor layer.

3. The light emitting device package according to claim 1, wherein the first electrode or the second electrode has a tetragonal shape, a polygonal shape or a circular shape when viewed from the top.

4. The light emitting device package according to claim 1, wherein an upper surface of the insulating layer is located on a same plane as the upper surfaces of the first electrode and the second electrode.

* * * * *